United States Patent
Liu et al.

(10) Patent No.: US 8,502,182 B2
(45) Date of Patent: Aug. 6, 2013

(54) MEMORY DEVICE HAVING SELF-ALIGNED CELL STRUCTURE

(75) Inventors: Jun Liu, Boise, ID (US); Michael P. Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 552 days.

(21) Appl. No.: 12/367,395

(22) Filed: Feb. 6, 2009

(65) Prior Publication Data

US 2010/0200830 A1 Aug. 12, 2010

(51) Int. Cl.
*H01L 47/00* (2006.01)
*H01L 21/311* (2006.01)
*G06F 13/28* (2006.01)

(52) U.S. Cl.
USPC ................................ 257/4; 438/700; 710/22

(58) Field of Classification Search
USPC ............ 257/1–7, E21.09, E45.002; 438/700; 710/22; 365/163
See application file for complete search history.

(56) References Cited

U.S. PATENT DOCUMENTS

| | | | | | |
|---|---|---|---|---|---|
| 3,796,926 | A | * | 3/1974 | Cole et al. | 257/4 |
| 3,827,033 | A | * | 7/1974 | Quilliam | 365/163 |
| 5,879,955 | A | * | 3/1999 | Gonzalez et al. | 438/128 |
| 6,118,135 | A | * | 9/2000 | Gonzalez et al. | 257/3 |
| 6,825,489 | B2 | * | 11/2004 | Kozicki | 257/42 |
| 7,335,906 | B2 | * | 2/2008 | Toda | 257/2 |
| 8,163,593 | B2 | * | 4/2012 | Raghuram et al. | 438/95 |
| 2006/0243973 | A1 | * | 11/2006 | Gilton | 257/46 |

FOREIGN PATENT DOCUMENTS

| | | |
|---|---|---|
| KR | 100780964 | 12/2007 |
| KR | 20080043173 | 5/2008 |
| KR | 100852233 | 8/2008 |
| WO | WO-2010091283 A2 | 8/2010 |
| WO | WO-2010091283 A3 | 2/2011 |

OTHER PUBLICATIONS

"International Application Serial No. PCT/US2010/023363, Search Report mailed Dec. 13, 2010", 4 pgs.
"International Application Serial No. PCT/US2010/023363, Written Opinion mailed Dec. 13, 2010", 6 pgs.
Ahn, S J, et al., "Highly reliable 50nm contact cell technology for 256Mb PRAM", *Symposium on VLSI Technology, 2005. Digest of Technical Papers. 2005.*, (Jun. 14-16, 2005), 98-99.
Cho, Woo Yeong, et al., "A 0.18 μm 3.0 V 64 Mb non-volatile phase-transition random-access memory (PRAM)", *Solid-State Circuits Conference, Feb. 15-19, 2004; Digest of Technical Papers. ISSCC. 2004 IEEE International*, (Feb 2004), 293-300.
Oh, J. H., et al., "Full Integration of Highly Manufacturable 512Mb PRAM based on 90nm Technology", Electron Devices Meeting, 2006. IEDM, International Volume, Dec. 11-13, 2006, (Dec. 2006), 1-4.

* cited by examiner

*Primary Examiner* — Fernando L Toledo
*Assistant Examiner* — Neil Prasad
(74) *Attorney, Agent, or Firm* — Schwegman, Lundberg & Woessner, P.A.

(57) ABSTRACT

Some embodiments include apparatus and methods having a memory device with diodes coupled to memory elements. Each diode may be formed in a recess of the memory device. The recess may have a polygonal sidewall. The diode may include a first material of a first conductivity type (e.g., n-type) and a second material of a second conductive type (e.g., p-type) formed within the recess.

18 Claims, 32 Drawing Sheets

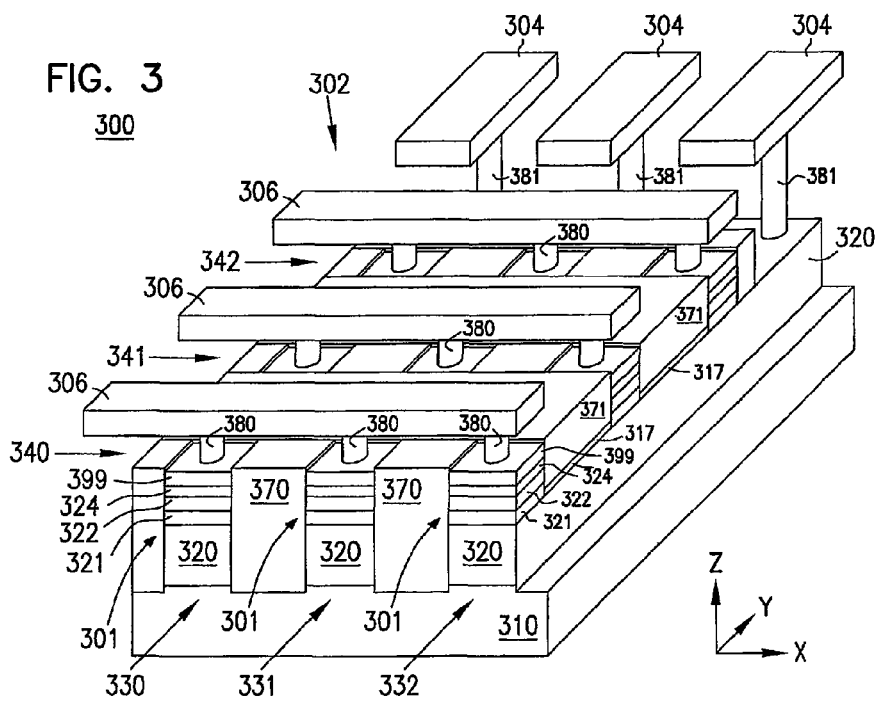
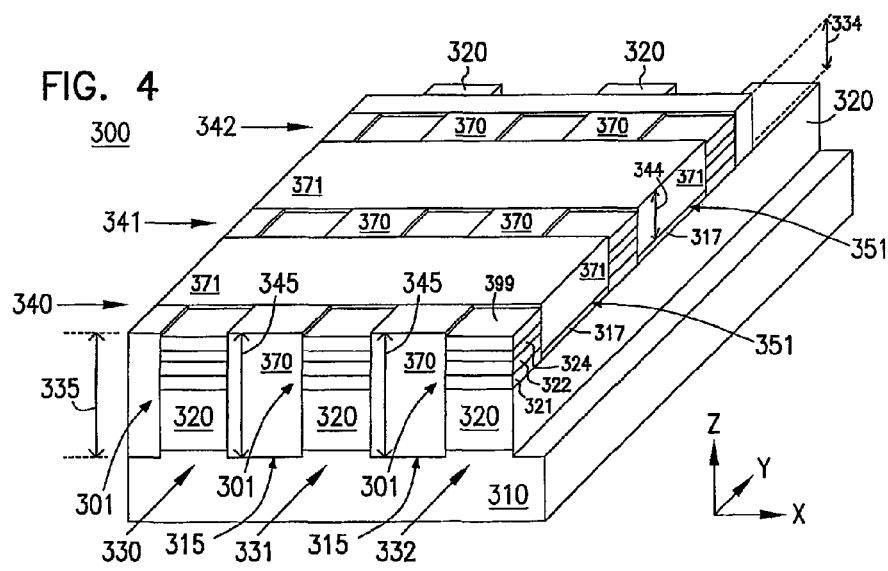

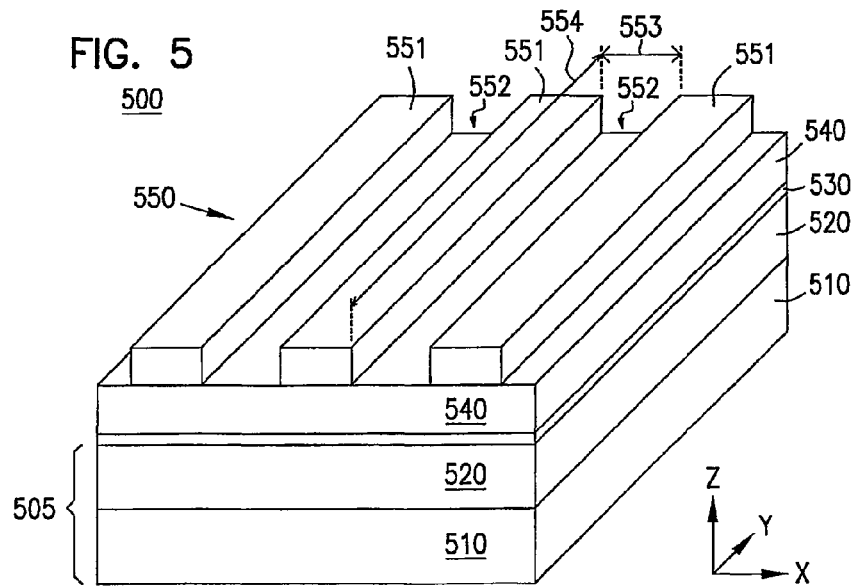
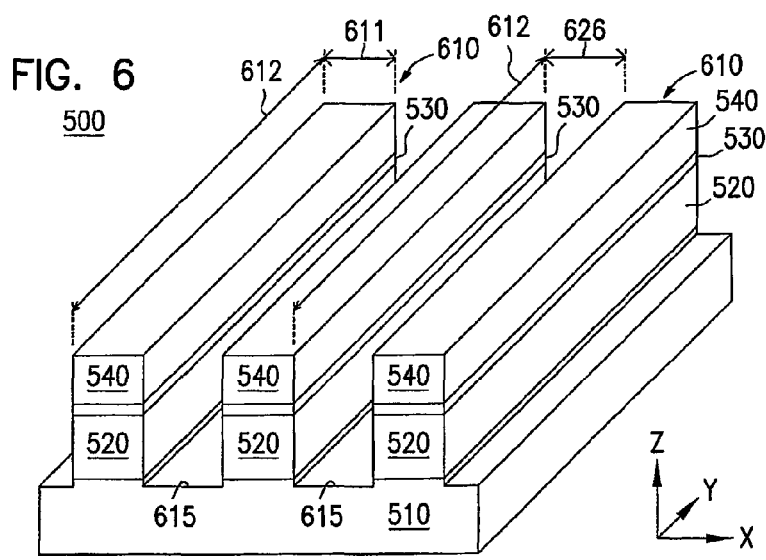

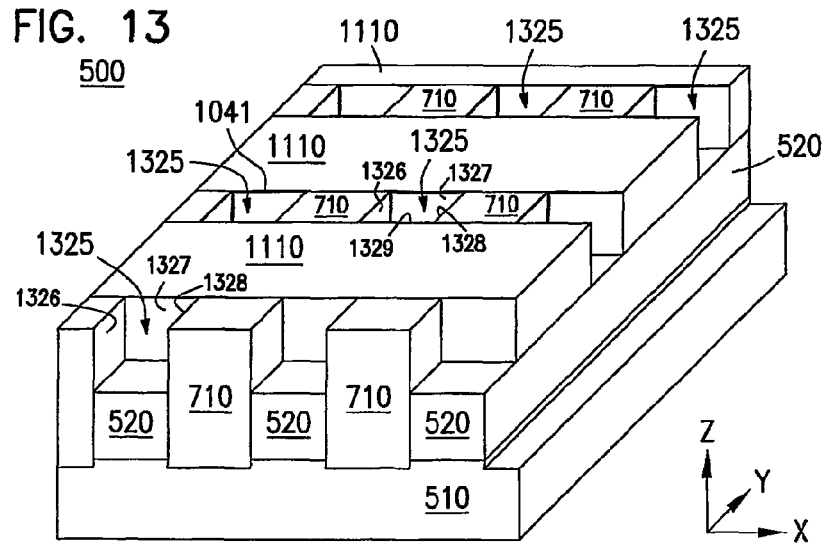
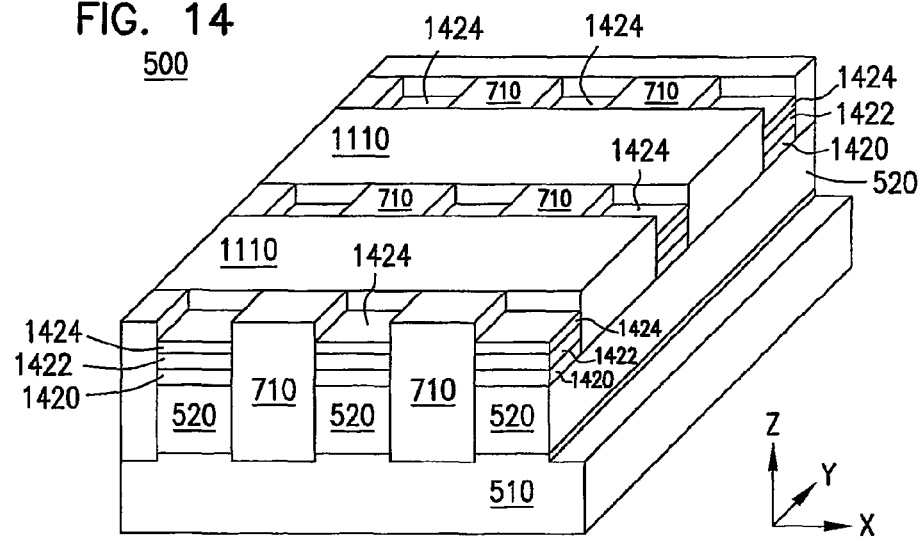

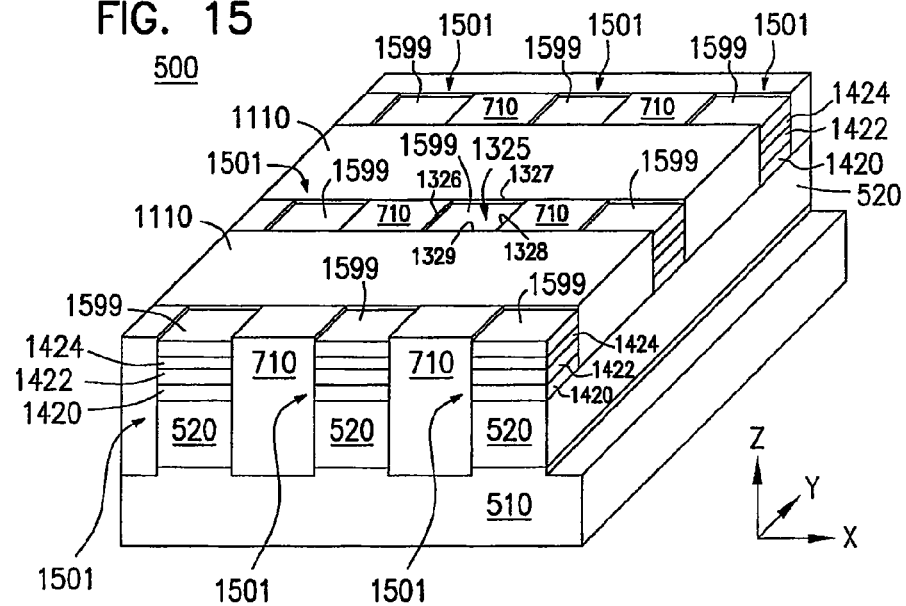
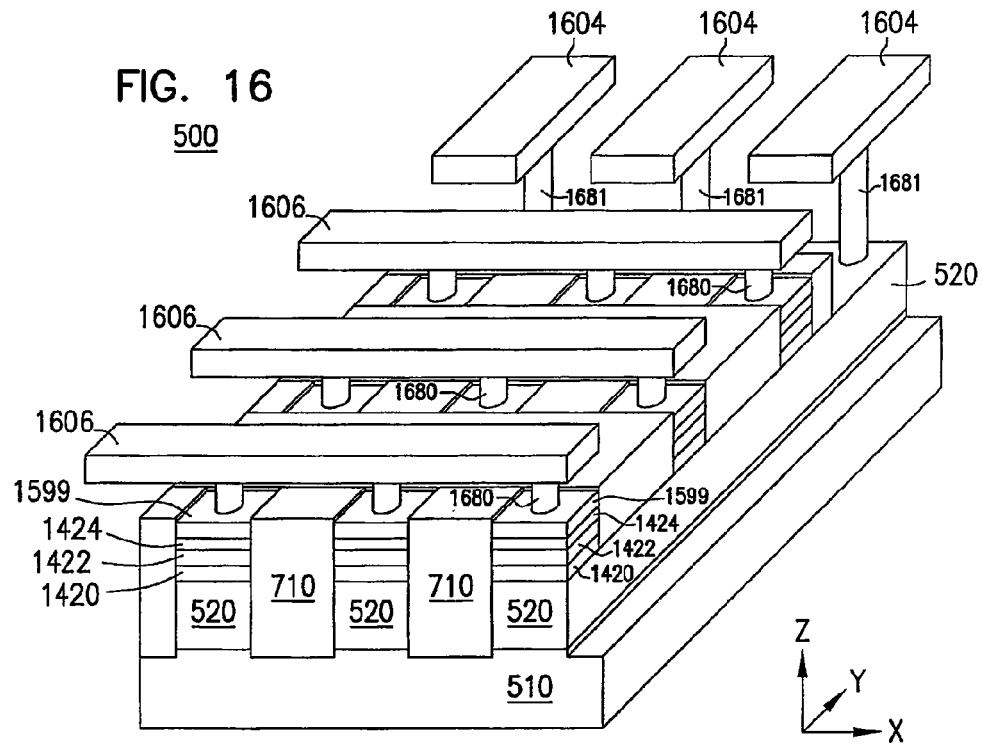

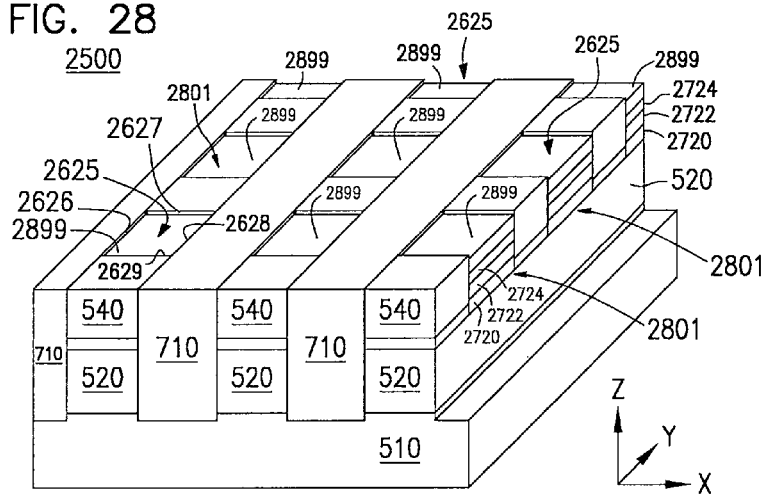
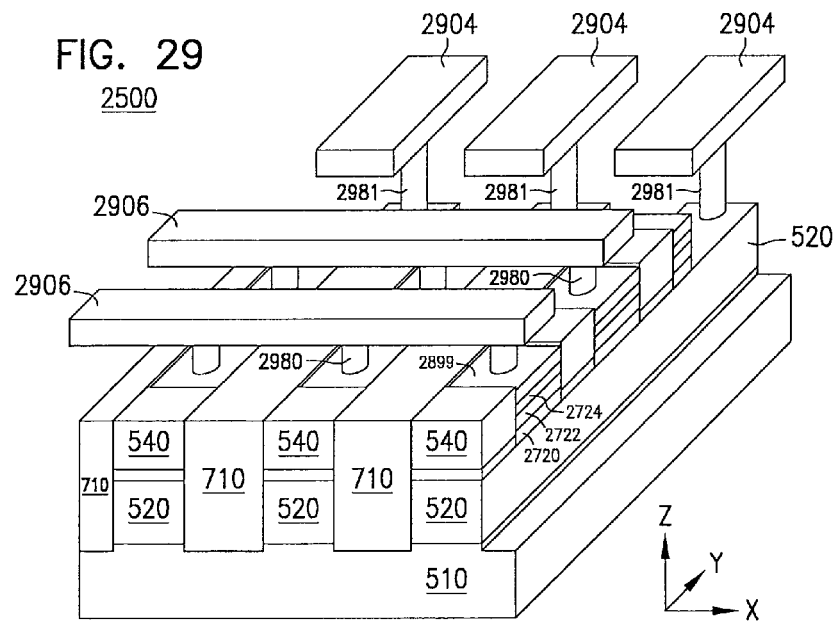

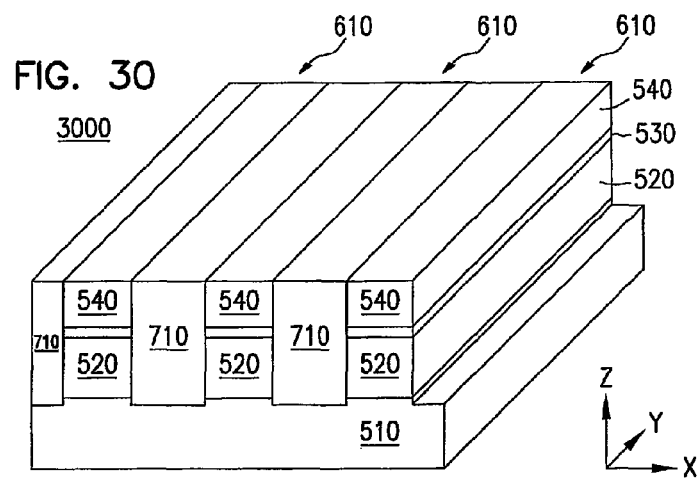
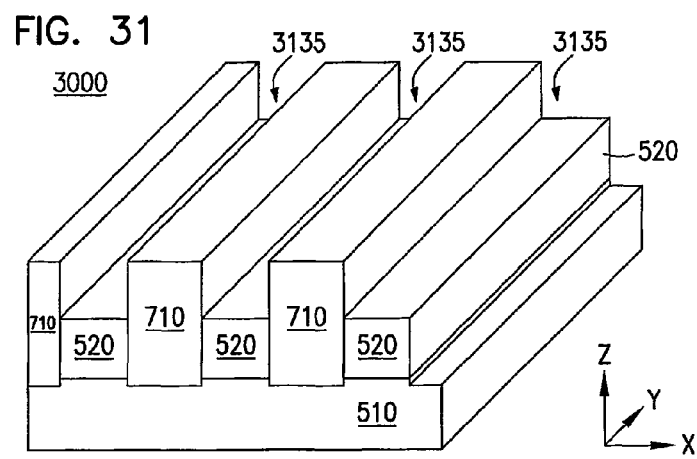

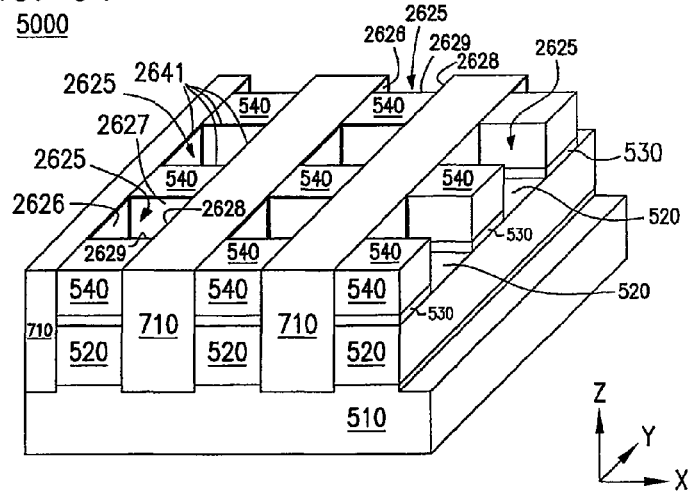
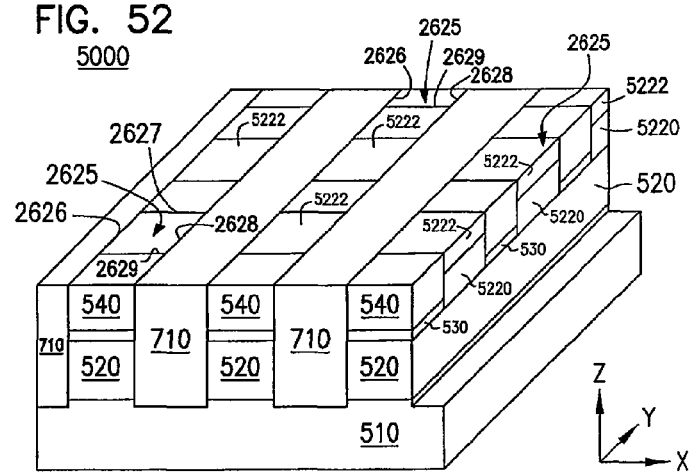

5900

6000

MEMORY DEVICE HAVING SELF-ALIGNED CELL STRUCTURE

BACKGROUND

Computers and other electronic products usually have a memory device with numerous memory cells to store data and other information. A conventional memory device is normally formed using various fabrication processes or steps. For example, one or more processes may form one part of the device and one or more additional processes may form another part of the device. Further processes may also form features that connect the parts of the device together. If the processes are not carefully planned, device defects or poor device performance may occur.

BRIEF DESCRIPTION OF THE DRAWINGS

FIG. 3 shows a partial three-dimension (3D) diagram of a memory device, according to an embodiment of the invention.

FIG. 4 shows a view of the memory device of FIG. 3 without some of its features.

FIG. 5 through FIG. 16 show processes of forming a memory device, according to an embodiment of the invention.

FIG. 25 through FIG. 29 show processes of forming a memory device with recesses having different sidewall materials, according to an embodiment of the invention.

FIG. 30 through FIG. 39 show processes of forming a memory device with epitaxial silicon formed before diode formation, according to an embodiment of the invention.

FIG. 50 through FIG. 58 show processes of forming a memory device with conductive materials simultaneously formed over diodes and between diodes of the memory device, according to an embodiment of the invention.

DETAILED DESCRIPTION

Figure 1:
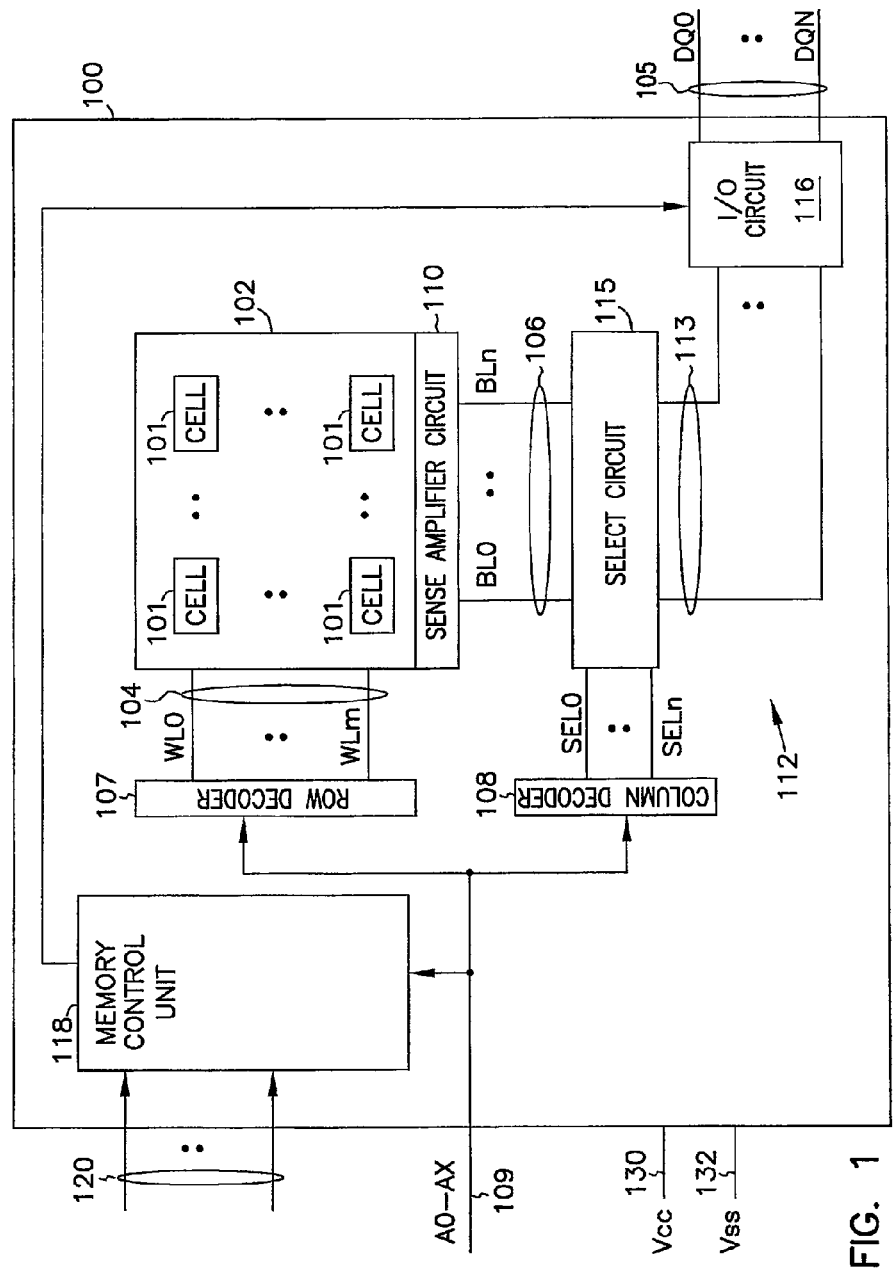
FIG. 1 shows a block diagram of a memory device having a memory array with memory cells, according to an embodiment of the invention.

FIG. 1 shows a block diagram of a memory device 100 having a memory array 102 with memory cells 101, according to an embodiment of the invention. Memory cells 101 may be arranged in rows and columns along with conductive lines 104 (e.g., wordlines having signals WL0 through WLm) and conductive lines 106 (e.g., bit lines having signals BL0 through BLn). Memory device 100 uses conductive lines 104 and conductive lines 106 to transfer information to and from memory cells 101. Row decoder 107 and column decoder 108 receive address signals A0 through AX on lines 109 (e.g., address lines) to determine which memory cells 101 are to be accessed. A sense amplifier circuit 110 operates to determine the value of information read from memory cells 101 and provide the information in the form of signals to conductive lines 106. Sense amplifier circuit 110 also uses the signals on conductive lines 106 to determine the value of information to be written to memory cells 101. Memory device 100 includes circuitry 112 to transfer information between memory array 102 and lines (e.g., data lines) 105. Signals DQ0 through DQN on lines 105 represent information read from or written into memory cells 101. Lines 105 may include nodes within memory device 100 or pins (or solder balls) on a package where memory device 100 may reside. Other devices external to memory device 100 (e.g., a memory controller or a processor) may communicate with memory device 100 through lines 105, 109, and 120.

Memory device 100 performs memory operations such as a read operation to read information from memory cells 101 and a programming operation (sometime referred to as write operation) to program (e.g., write) information into memory cells 101. A memory control unit 118 controls the memory operations based on control signals on lines 120. Examples of the control signals on lines 120 include one or more clock signals and other signals to indicate which operation, (e.g., a programming or read operation) memory device 100 may perform. Other devices external to memory device 100 (e.g., a processor or a memory controller) may control the values of the control signals on lines 120. Specific values of a combination of the signals on lines 120 may produce a command (e.g., programming or read command) that causes memory device 100 to perform a corresponding memory operation (e.g., programming or read operation).

Each of memory cells 101 may be programmed to store information representing a value of a single bit or a value of multiple bits such as two, three, four, or another number of bits. For example, each of memory cells 101 may be programmed to store information representing a binary value "0" or "1" of a single bit. In another example, each of memory cells 101 may be programmed to store information representing a value of multiple bits, such as one of four possible values "00", "01", "10", and "11" of two bits, one of eight possible values "000", "001", "010", "011", "100", "101", "110" and "111", or one of other values of another number of multiple bits.

Memory device 100 receives a supply voltage, including supply voltage signals Vcc and Vss, on lines 130 and 132, respectively. Supply voltage signal Vss may operate at a ground potential (e.g., having a value of approximately zero volts). Supply voltage signal Vcc may include an external voltage supplied to memory device 100 from an external power source such as a battery or an alternating-current to direct-current (AC-DC) converter circuitry.

Circuitry 112 of memory device 100 includes a select circuit 115 and an input/output (I/O) circuit 116. Column decoder 108 selectively activates the SEL0 through SELn signals based on the A0 through AX address signals on lines 109. Select circuit 115 responds to signals SEL0 through SELn to select the signals on conductive lines 106 and 113 that represent the information read from or programmed into memory cells 101. Select circuit 115 selects the signals on conductive lines 106 and 113 to provide communication between memory array 102 and I/O circuit 116 during read and programming operations.

Memory device 100 may include a non-volatile memory device and memory cells 101 may include non-volatile memory cells such that memory cells 101 may retain information stored thereon when power (e.g., Vcc or Vss, or both) is disconnected from memory device 100. For example, memory device 100 may include a phase change memory device such that each of memory cells 101 may include a memory element having a material (e.g., chalcogenide material) in which at least a portion (e.g., programmable portion) of the material may be programmed to cause that portion to change between different phases. The phases may include a crystalline phase (which is sometimes referred to as a crystalline state) and an amorphous phase (which is sometimes referred to as an amorphous state). Each of memory cells 101 may have a resistance state corresponding to a resistance value when the memory cell is programmed. Different resistance values may represent different values of information programmed in each of memory cells 101.

Memory device 100 performs a programming operation when it receives (e.g. from an external processor or a memory controller) a programming command and value of information to be programmed into one or more of selected memory cells among memory cells 101. Based on the value of the information, memory device 100 programs the selected memory cells to cause them to have appropriate resistance values to represent the values of the information.

One skilled in the art may recognize that memory device 100 may include other features that are not shown to help focus on the embodiments described herein.

Memory device 100 includes memory devices and memory cells that are similar to or identical to those described below with reference to FIG. 2 through FIG. 49.

Figure 2:
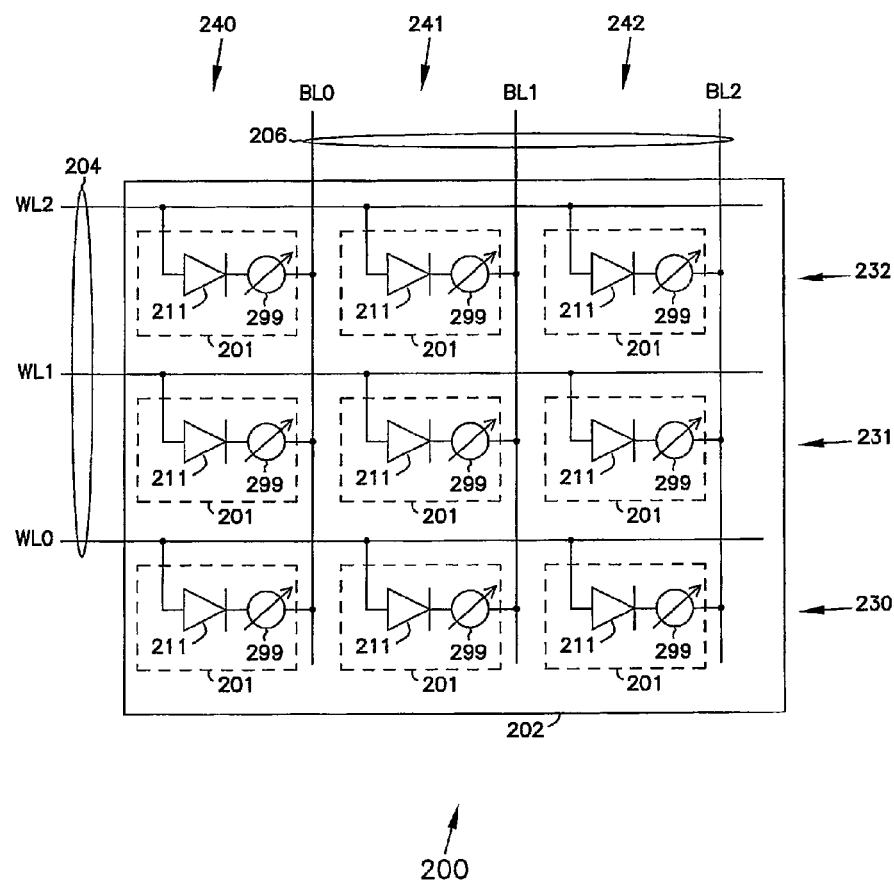
FIG. 2 shows a partial schematic diagram of a memory device having a memory array with memory cells having diodes and memory elements, according to an embodiment of the invention.

FIG. 2 shows a partial schematic diagram of a memory device 200 having a memory array 202 including memory cells 201, according to an embodiment of the invention. Memory cells 201 may include phase change memory cells. Memory array 202 may correspond to memory array 102 of FIG. 1. As shown in FIG. 2, memory cells 201 are arranged in rows 230, 231, and 232 along with conductive lines 204 having signals WL0, WL1, and WL2, and columns 240, 241, and 242 along with conductive lines 206 having signals BL0, BL1, and BL2. Each memory cell 201 may include a diode 211 and a memory element 299.

As shown in FIG. 2, each diode within a group of diodes in the same row (e.g., row 230) includes one diode terminal coupled to the same conductive line (e.g., the same line with the signal WL0) and another diode terminal coupled (through a memory element 299) to a different conductive line among conductive lines with signals BL0, BL1, and BL2.

Diodes 211 may turn on (e.g., by using appropriate values of signals WL0, WL1, and WL2) to allow access to memory elements 299 to read information (e.g., measure a resistance value) from memory elements 299 or program information into memory elements 299 (e.g., causing memory elements 299 to have a specific resistance value).

For example, a programming operation may apply appropriate values to signals WL0, WL1, and WL2 to selectively turn on diode 211 of a selected memory cell 201 and then apply a current (e.g., programming current) through a selected memory element 299 of the selected memory cell. The current causes at least a portion of the material of the memory element 299 to heat up. After the material heats, the programming operation allows the material to rapidly cool. These heating and cooling actions may change the phase of the material, such as from a crystalline phase before the programming operation to an amorphous phase after the programming operation. The phase change may be reversible (e.g., changing from an amorphous phase to a crystalline phase). Different phases of the material may cause selected memory element 299 to have different resistance states corresponding to different resistance values, which correspond to different values of the information that is being stored in the selected memory element 299.

In another example, a read operation may apply appropriate values to signals WL0, WL1, and WL2 to selectively turn on diode 211 of a selected memory cell 201 and then apply a current (e.g., read current) through a selected memory element 299 of the selected memory cell. The read operation may measure the resistance of the memory cell based on a read voltage generated from the read current to determine the corresponding value of information stored therein. For example, in each of memory cells 201, a different resistance value may provide a different value (e.g., current or voltage value) on signals BL0, BL1, and BL2 when the current passes through memory elements 299. Other circuitry of the memory device (e.g., circuit such as I/O circuit 116 of FIG. 1) may use signals BL0, BL1, and BL2 to measure the resistance value of memory elements 299 to determine the value of the information.

The current used during a read operation may have a value different from the current used during a programming operation. For example, in a programming operation, the value of the signal (e.g., WL0, WL1, or WL2 in FIG. 2) that creates a current flowing through a selected memory element 299 may be sufficient to cause the material of at least a portion of the selected memory element to change between different phases to alter the resistance value of the selected memory element based on the value of the information to be stored in that selected memory elements. In a read operation, the value of the signal (e.g., WL0, WL1, or WL2 in FIG. 2) that creates a current flowing through a selected memory element 299 may be sufficient to create the current but insufficient to cause any portion of the selected memory element to change between different phases so that the value of the information stored in the selected memory element may remain unchanged in the read operation.

Memory cells 201 of FIG. 2 may include memory cells similar to or identical to the memory cells described below with reference to FIG. 3 through FIG. 49.

FIG. 3 through FIG. 49 show some features that are the same or similar. Thus, for simplicity, the description for the same or similar features in FIG. 3 through FIG. 49 may not be repeated. For example, this description may not repeat the description of the same or similar features among the memory devices shown in FIG. 3 through FIG. 49, such as memory device 300 (FIG. 3 and FIG. 4), memory device 500 (FIG. 5 through FIG. 16), memory device 1700 (FIG. 17 through FIG. 14), memory device 2500 (FIG. 25 through FIG. 29), memory device 3000 (FIG. 30 through FIG. 39), and memory device 4000 (FIG. 40 through FIG. 49).

FIG. 3 shows a partial 3D diagram of a memory device 300, according to an embodiment of the invention. Memory device 300 includes a memory array 302, which may correspond to memory array 102 of FIG. 1 and memory array 202 of FIG. 2. FIG. 3 also shows an x-direction, a y-direction perpendicular to the x-direction, and a z-direction perpendicular to both the x-direction and the y-direction. Memory device 300 includes memory cells 301 arranged in rows 330, 331, and 332 in the y-direction and columns 340, 341, and 342 in the x-direction. Insulation material 370 is formed between rows 330, 331, and 332 to insulate the memory cells in one row from the memory cells in another row. Insulation material 371 is formed between 340, 341, and 342 to insulate the memory cells in one column from memory cells in another column.

Memory cells 301 in rows 330, 331, and 332 may be coupled to conductive lines 304 through conductive contacts 381. Memory cells 301 in columns 340, 341, and 342 may be coupled to conductive lines 306 through conductive contacts 380. Conductive lines 304 and 306 may be arranged over memory cells 301 in the z-direction. Conductive lines 304 and conductive lines 306 may correspond to conductive lines 204 and conductive lines 206, respectively, of FIG. 2.

As shown in FIG. 3, memory cells 301 in the same row (e.g., row 332) may include the same material 320 extending in the y-direction and coupled to one of conductive lines 304 through a conductive contact 381. Memory cells 301 in the same column (e.g., column 342) are coupled to one of conductive lines 306 through multiple conductive contacts 380. FIG. 3 show only three memory cells 301 in each row and three memory cells 301 in each column as an example. The number of memory cells 301 in each row and each column may vary.

Each memory cell 301 may include different materials 320, 321, 322, 324, and 399 that are arranged as multiple layers with respect to the z-direction over a substrate 310. In each memory cell 301, materials 321, 322, 324, and 399 may form a diode and a memory element of the memory cell. The diodes and memory elements of memory cells 301 may be shown schematically like diodes 211 and memory elements 299 of FIG. 2.

In FIG. 3, materials 321 and 322 may form at least a part of a diode of each memory cell 301. For example, material 321 may include one conductivity type (e.g., n-type silicon material) and material 322 may include another conductivity type (e.g., p-type silicon material). The n-type and p-type materials may form at least a part of a diode in each memory cell 301. For example, the n-type and p-type materials may form a p-n junction of a diode in each memory cell 301. Although this description discusses p-n junction diodes, other types of diodes, such as various kinds of metal-insulator-metal diodes or low temperature oxide diodes, may be formed.

Material 399 may form a memory element of each memory cell 301. Material 399 may include a chalcogenide material. Examples of chalcogenide materials include materials that have various combinations of one or more of germanium (Ge), antimony (Sb), and telluride (Te), and other similar materials. For example, material 399 may include a compound of germanium (Ge), antimony (Sb), and telluride (Te), such as $Ge_2Sb_5Te_5$.

Material 324 may include conductive material with a resistivity lower than the resistivity of materials 321 and 322. Material 324 may also include conductive material with a resistivity lower than the resistivity of materials 399. The relatively lower resistivity of material 324 may reduce contact resistance of the diode that is formed by materials 321 and 322 to improve electrical conductivity through the diode and improve overall electrical conductivity of memory cells 301. An example of material 324 may include cobalt silicide (e.g., $CoSi_2$) or nickel silicide (e.g., NiSi). Other conductive materials with a resistivity lower than the resistivity of materials 321 and 322 may be used.

FIG. 4 shows memory device 300 of FIG. 3 without conductive lines 304 and 306 and conductive contacts 380 and 381 to help discuss details of memory device 300. As shown in FIG. 4, memory device 300 includes trenches 315 extending in the y-direction along multiple cells and trenches 351 extending x-direction along multiple cells such that trenches 315 and trenches 351 are perpendicular to each other.

Each trench 315 is located between two of the rows 330, 331, and 332 and filled with material 370. Each trench 351 is located between two of the columns 340, 341, and 342 and filled with material 371. As shown in FIG. 4, each trench 315 has a depth 335 in the z-direction. Thus, material 370 filled in each trench 315 may have a thickness 345 that corresponds to depth 335. Each trench 351 has a depth 334 in the z-direction. Thus, material 371 filled in each trench 351 may have a thickness 344 that corresponds to depth 334. As shown in FIG. 4, depth 335 is greater than depth 334 and thickness 345 is greater than thickness 344.

Memory device 300 may also include material 317 located at the bottom of each trench 351 and are arranged in the y-direction and coupled to material 321 of each memory 301. In some devices, material 317 may be omitted. However, the inclusion of material 317 in memory device 300 may reduce parasitic effect created from materials of different conductivity types between adjacent diodes in the same row in the y-direction. Material 317 may also create a path to improve heat dissipation from memory cells 301 to conductive lines 304. Further, material 317 may reduce resistance of the connection between memory cells 301 and conductive lines 304 to improve electrical conductivity between them.

Various processes described below with reference to FIG. 5 through FIG. 49 may be used to form one or more portion of memory device 300.

FIG. 5 through FIG. 16 show processes of forming a memory device 500, according to an embodiment of the invention. FIG. 5 shows memory device 500 having a substrate 505 and multiple materials 520, 530, and 540 formed in or over substrate 505. Substrate 505 may initially include p-type semiconductor (e.g., silicon) material. Forming material 520 may include inserting (e.g., implanting) n-type impurities into a portion (e.g., top portion) of substrate 505. Examples of n-type impurities include an element such as phosphorus (P) or arsenic (As). Thus, material 520 may include an n-type semiconductor material. The remaining portion (e.g., bottom portion) of substrate 505, which includes material 510, that has not been inserted with n-type impurities may remain a p-type semiconductor material. Forming material 530 may include depositing an insulation material, such as a silicon based material (e.g., silicon oxide) over material 520. Forming material 540 may include depositing an insulation material, such as a silicon-based material (e.g., silicon nitride) over material 530.

In some cases, material 540 (e.g., silicon nitride) may create undesirable stress to material 520. Therefore, in some cases, forming material 530 between materials 520 and 540 may reduce or prevent stress to material 520 caused by material 540. In some other cases, however, material 530 may be omitted if material 540 is selected such that it may not cause stress to material 520 or such that potential stress may have an insignificant effect to material 520 or memory device 500, or both. Thus, in some cases, material 530 may be omitted and material 540 may be formed directly on material 520.

FIG. 5 also shows an x-direction, a y-direction perpendicular to the x-direction, and a z-direction perpendicular to both the x-direction and the y-direction. As shown in FIG. 5, materials 510, 520, 530, and 540 may form different layers, one layer over (or on) one or more other layers in the z-direction.

As used herein, the term "on" used with respect to two or more materials (or layers), one "on" the other, means at least some contact between the materials (or layers), while "over" means the materials (or layers) are in close proximity, but possibly with one or more additional intervening materials (or layers) such that contact is possible but not required. Neither "on" nor "over" implies any directionality as used herein unless stated as such.

FIG. 5 also shows a masking structure 550 formed over materials 540, 530, 520, and 510. Masking structure 550 may be used to pattern, e.g., to selectively remove, portions of materials underneath masking structure 550 during some of the processes of forming memory device 500. As shown in FIG. 5, masking structure 550 includes a pattern defined by masking portions 551 and openings 552. Each opening 552 has a width 553 extending in the x-direction and a length 554 extending in the y-direction. Length 554 is substantially greater than width 553. Masking structure 550 may include a photoresist that may be used in a photolithography patterning process to pattern materials 540, 530, 520, and 510.

FIG. 6 shows memory device 500 after device structures 610 and trenches 615 have been formed and masking structure 550 (FIG. 5) has been removed. A process such as etching (e.g., dry etch) may be used to remove portions of materials 540, 530, 520, and 510 at openings 552 (FIG. 5). The remaining portions of materials 540, 530, 520, and 510 (portions underneath masking portions 551) form device structures 610. Each device structure 610 has a width 611 extending in the x-direction and a length 612 extending in the y-direction. Length 612 is substantially greater than width 611. Each trench 615 may have a bottom on material 510, a width 616 extending in the x-direction, and a length 617 extending in the y-direction. Length 617 is substantially greater than width 616.

Figure 7:
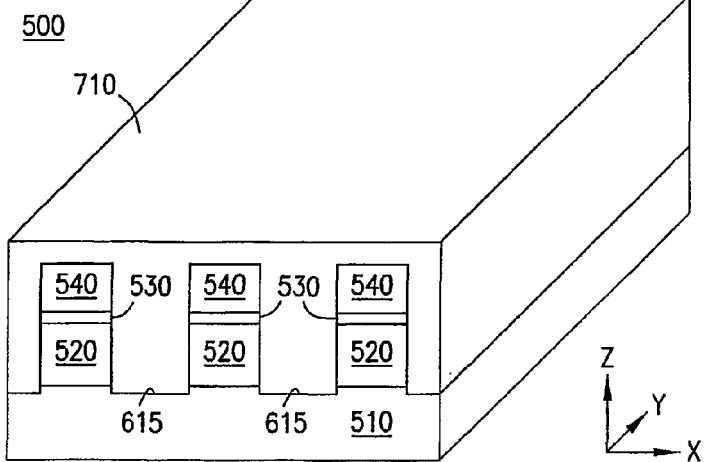

FIG. 7 shows memory device 500 after a material 710 has been formed, e.g., by deposition, to fill trenches 615 to insulate device structures 610 (FIG. 6) from each other. Material 710 may include insulation material, e.g., silicon oxide or other insulation material.

Figure 8:
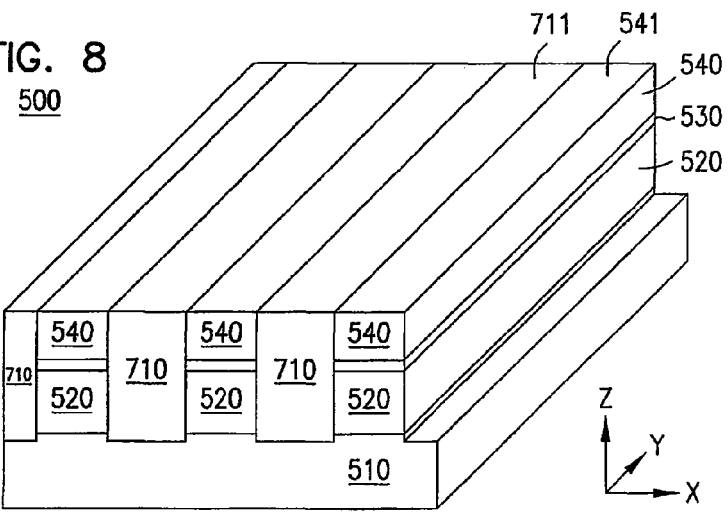

FIG. 8 shows memory device 500 after material 710 has been planarized, e.g., through chemical mechanical polishing (CMP) or etch back to expose a portion, e.g., an upper surface 541, of material 540. As shown in FIG. 8, an upper surface 711 of material 710 and upper surface 541 of material 540 are on the same plane following the planarization or etch back process.

Figure 9:
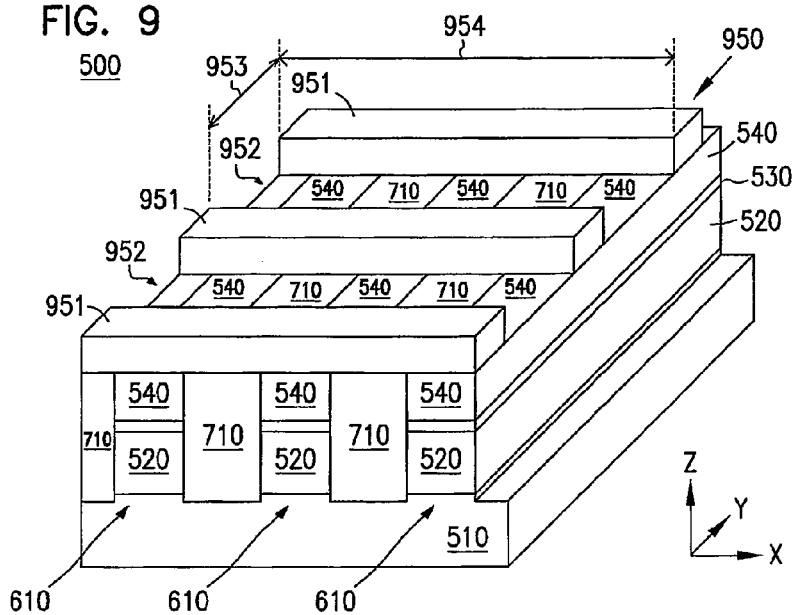

FIG. 9 shows memory device 500 after a masking structure 950 has been formed over device structures 610 and material 710. Masking structure 950 may be used to pattern, e.g., to selectively remove, portions of materials underneath masking structure 950 during further processes to form memory device 500. As shown in FIG. 9, masking structure 950 includes a pattern defined by masking portions 951 and openings 952. Each opening 952 has a width 953 extending in the y-direction and a length 954 extending in the x-direction. Length 954 is substantially greater than width 953. Masking structure 950 may include a photoresist that may be used in a photolithography patterning process to pattern device structures 610.

As shown in FIG. 9 and FIG. 5 masking structures 950 and 550 are positioned such that their patterns are perpendicular to each other. For example, the greater dimension (length 954 in the x-direction) of openings 952 of masking structure 950 of FIG. 9 is perpendicular to the greater dimension (length 554 in the y-direction) of openings 552 of masking structure 550 of FIG. 5. Positioning masking structures 950 and 550 perpendicularly to each other during formation of memory device 500 may allow self-alignment of some features, such as diodes (to be formed in additional processes), of memory device 500 to improve its material quality and functions, as described below.

Figure 10:
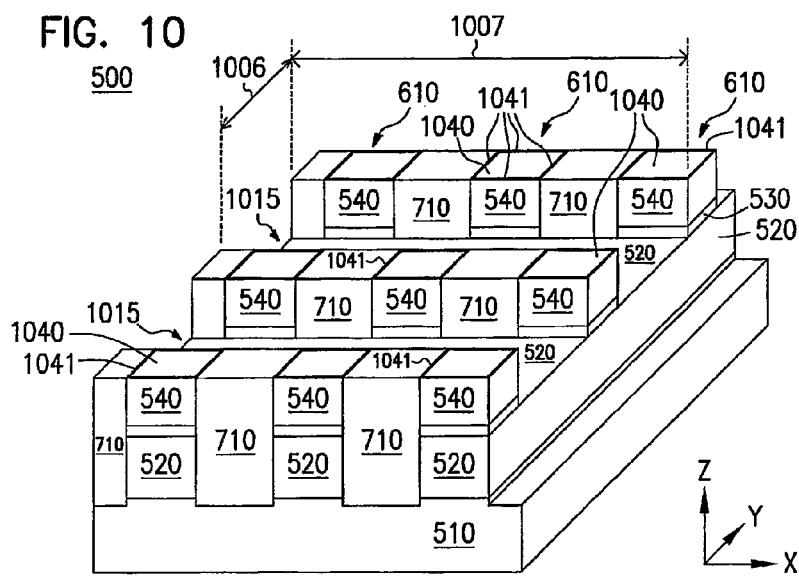

FIG. 10 shows memory device 500 after trenches 1015 have been formed and masking structure 950 of FIG. 9 has been removed. A removal process such as etching (e.g., dry etch or wet etch) may be used to remove portions of materials 540 and 530 of each device structure 610 at openings 952 and portions of material 710 at openings 952 to form trenches 1015. Each trench 1015 may have a bottom on material 520, a width 1006 extending in the y-direction, and a length 1007 extending in the x-direction. Length 1007 is substantially greater than width 1006. As shown in FIG. 10, the greater dimension (length 1007) of each trench 1015 extends in the x-direction through device structures 610 to form protrusions 1040 having a perimeter 1041. Since protrusions 1040 are formed using masking structures 550 (FIG. 5) and 950 (FIG. 9) with patterns that are positioned perpendicularly to each other, perimeter 1041 of FIG. 10 may have a polygonal shape.

Figure 11:
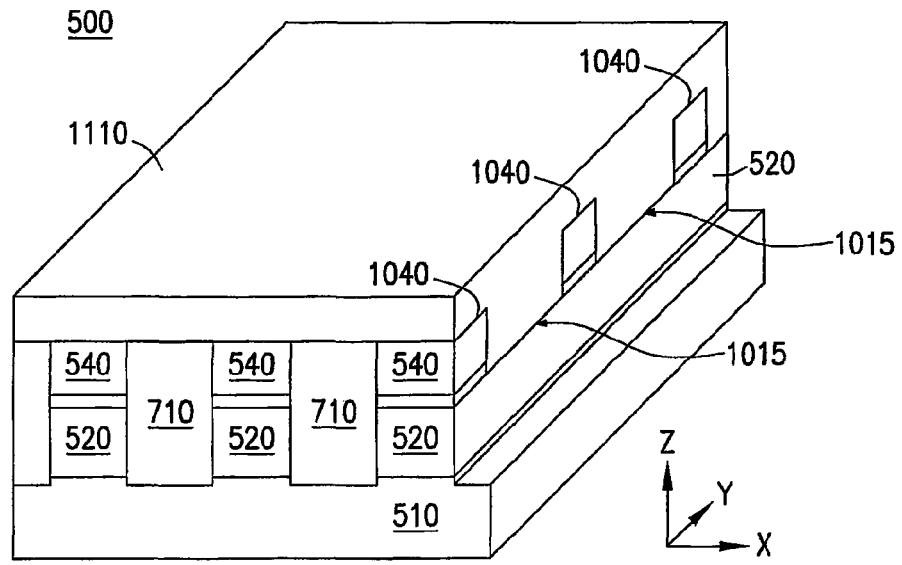

FIG. 11 shows memory device 500 after a material 1110 has been formed, e.g., by deposition, to fill trenches 1015 to insulate protrusions 1040 from each other in the y-direction. Material 1110 may include insulation material, e.g., silicon oxide or other insulation material. Material 1110 may include the same material composition as that of material 710. For example, both materials 1110 and 710 may include silicon oxide.

Figure 12:
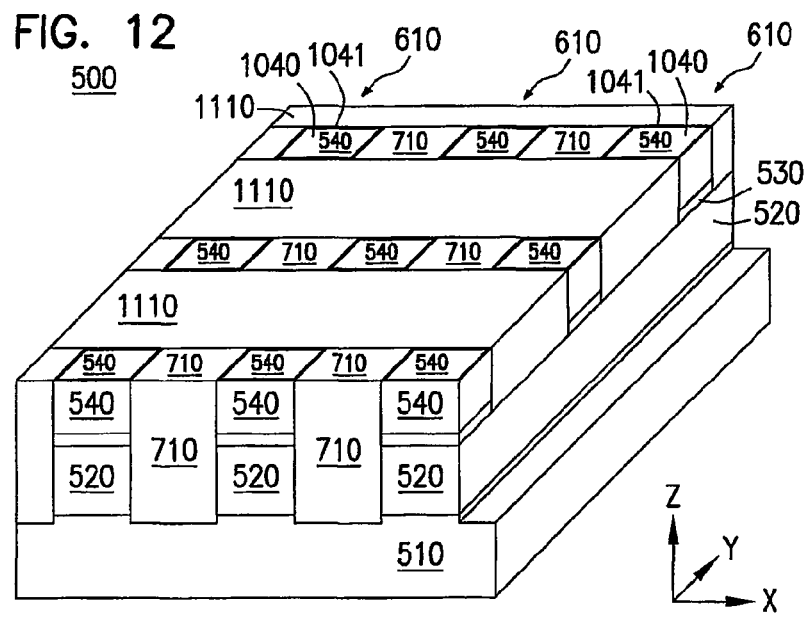

FIG. 12 shows memory device 500 after material 1110 has been planarized, e.g., through CMP or etch back, to expose material 540 of protrusions 1040. As shown in FIG. 12, protrusions 1040 along the y-direction of the same device structure 610 are insulated from each other by material 1110, and protrusions 1040 along the x-direction between different device structures 610 are insulated from each other by material 710.

FIG. 13 shows memory device 500 after recesses 1325 have been formed. A process such as etching (e.g., dry etch or wet etch) may be used to remove material 540 and material 530 from each protrusion 1040 to expose material 520. As described above with reference to FIG. 5, in some cases, material 530 may be omitted and material 540 may be formed directly on material 520. Thus, the process associated with FIG. 13 described here may remove only material 540 (if material 530 is omitted) to expose material 520 when recesses 1325 are formed.

As shown in FIG. 13, each recess 1325 includes a bottom on material 520 and an opening that is shaped by perimeter 1041. Since perimeter 1041 may have a polygonal shape, each recess 1325 may also have a polygonal opening and a polygonal sidewall associated with the polygonal opening. The polygonal sidewall of each recess 1325 may be defined by four sidewall portions 1326, 1327, 1328, and 1329. As shown in FIG. 13, sidewall portions 1326 and 1328 are opposite from each other and are formed from material 710. Sidewall portions 1327 and 1329 are opposite from each other and are formed from material 1110. Sidewall portion 1326 is perpendicular to sidewall portion 1327, which is perpendicular to sidewall portion 1328. Sidewall portion 1328 is perpendicular to sidewall portion 1329. Since materials 710 and 1110 may include the same material (e.g., silicon oxide) the sidewall of each recess 1325 may also include the same material. Features, such as a diode and a memory element, may be formed in each recess 1325.

FIG. 14 shows memory device 500 after materials 1420, 1422, and 1424 have been formed in recesses 1325 (FIG. 13). Material 1420 may include n-type semiconductor material (e.g., n-type silicon). Material 1422 may include p-type semiconductor material (e.g., p-type silicon). Materials 1420 and 1422 may form at least a part of a diode. Material 1424 may include conductive material with a resistivity lower than the resistivity of materials 1420 and 1422. For example, material 1424 may include cobalt silicide or nickel silicide.

Forming materials 1420, 1422, and 1424 in recesses 1325 may include growing epitaxial silicon on material 520 to form material 1420. Thus, material 1420 may include single crystalline silicon. Impurities of n-type may be inserted (e.g., in situ doped or implanted) into the grown epitaxial silicon, so that material 1420 may include n-type epitaxial silicon. Impurities of p-type impurities may be inserted (e.g., in situ doped or implanted) into material 1420 such that a portion (e.g., top portion) of material may form material 1422. An example of p-type impurities includes an element such as boron (B). After material 1422 is formed, a silicidation process may be performed to form material 1424. As shown in FIG. 14, materials 1420 and 1422 may directly contact materials 710 and 1110 at sidewall portions 1326, 1327, 1328, and 1329.

FIG. 15 shows memory device 500 after a material 1599 has been formed in recesses 1325. Material 1599 may directly contact materials 710 and 1110 at sidewall portions 1326, 1327, 1328, and 1329. Material 1599 may form memory elements of memory cells 1501. Forming material 1599 may include depositing a chalcogenide material over material 1424 in recesses 1325.

Each memory cell 1501 may include a diode formed by at least materials 1420 and 1422 and a memory element having material 1599. Since materials 1420 and 1422 of the diode in each recess 1325 are formed within the same recess and materials 1420 and 1422 can be self-aligned to material 520 from using masking structures 550 (FIG. 5) and 950 (FIG. 9) that are perpendicular to each other, the diode of each recess 1325 can be considered as self-aligned diode.

Since the diodes in memory device 500 can be self-alignment diodes, misalignment of the diodes and other features (e.g., between materials 520 and 1420) in memory device 500 may be substantially reduced or absent. Therefore, in memory device 500, defects associated with the diodes may be reduced or absent. Moreover, some conventional devices may include device features, such as diodes and other features, that may be misaligned. The misalignment may create a constriction in a current path between the misaligned features in the conventional devices. The constriction may generate a phenomenon such as hot spot when the conventional devices operate, leading to poor device performance. In memory device 500, however, a reduction in or absence of the misalignment between materials 1420 and 520 may reduce or prevent the occurrence of hot spot. Thus, device performance may be improved.

FIG. 16 shows memory device 500 after additional features of memory device 500 have been formed. For example, conductive contacts 1680 and 1681 and conductive lines 1604 and 1606 have been formed. Conductive lines 1604 and conductive lines 1606 may correspond to conductive lines 204 and conductive lines 206, respectively, of FIG. 2. Conductive lines 1604 and conductive lines 1606 of FIG. 16 may also correspond to conductive lines 304 and conductive lines 306, respectively, of FIG. 3.

One skilled in the art may readily recognize that additional processes may be performed to form additional features of a memory device, such as memory device 500 described above. Thus, to help focus on the embodiments described herein, FIG. 5 through FIG. 16 described above and FIG. 17 through FIG. 49 described below show only some of the features of a memory device, such as memory device 500 (FIG. 5 through FIG. 16), memory device 1700 (FIG. 17 through FIG. 14), memory device 2500 (FIG. 25 through FIG. 29), memory device 3000 (FIG. 30 through FIG. 39), and memory device 4000 (FIG. 40 through FIG. 49).

FIG. 17 through FIG. 24 show processes of forming a memory device 1700 with conductive material 1730, according to an embodiment of the invention. Some of the processes used to form memory device 500 described above with reference to FIG. 5 through FIG. 16 may be used to form memory device 1700 described herein with reference to FIG. 17 through FIG. 24. Thus, for simplicity, similar materials and features between memory device 500 of FIG. 5 through FIG. 16 and memory device 1700 of FIG. 17 through FIG. 24 are given the same reference numbers.

The difference between memory device 1700 (FIG. 17) and memory device 500 (FIG. 5) is that material 1730 of memory device 1700 is different from material 530 of memory device 500. For example, material 1730 includes an electrically conductive material such as cobalt silicide or nickel silicide. In contrast, as described above, material 530 (FIG. 5) includes an insulating material such as silicon oxide. Another difference between memory device 1700 (FIG. 24) and memory device 500 (FIG. 16) is that a portion of material 1730 remains in memory device 1700 (FIG. 24) upon completion of the memory device. In contrast, as described above with reference to FIG. 5 through FIG. 16, material 530 between adjacent memory cells 1501 (FIG. 15) of memory device 500 is removed upon completion of the memory device.

Figure 17:
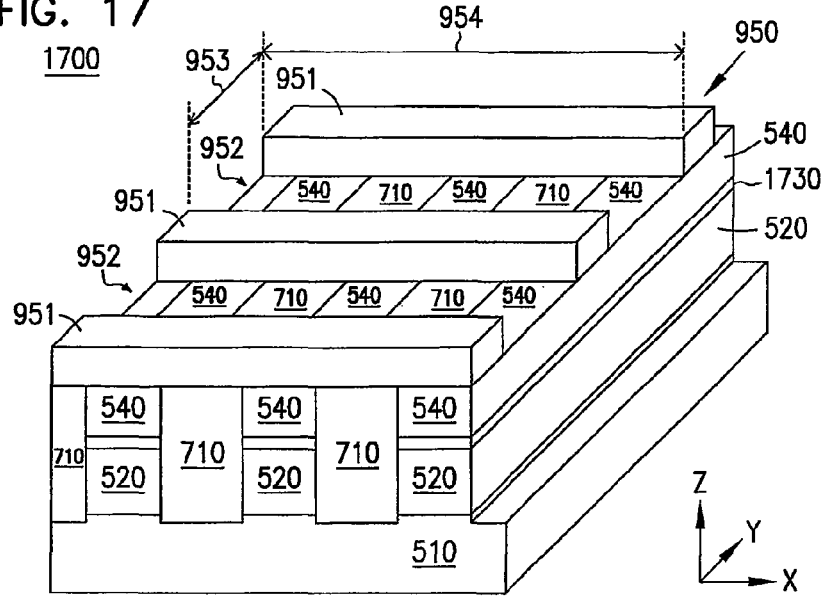
FIG. 17 through FIG. 24 show processes of forming a memory device with conductive material formed between diodes of memory cells of the memory device, according to an embodiment of the invention.

In FIG. 17, the structure of memory device 1700 up to this point may be formed using processes similar to those described above with reference to FIG. 5 through FIG. 9. However, as shown in FIG. 17, material 1730 (instead of material 530) has been formed between materials 520 and 540.

Figure 18:
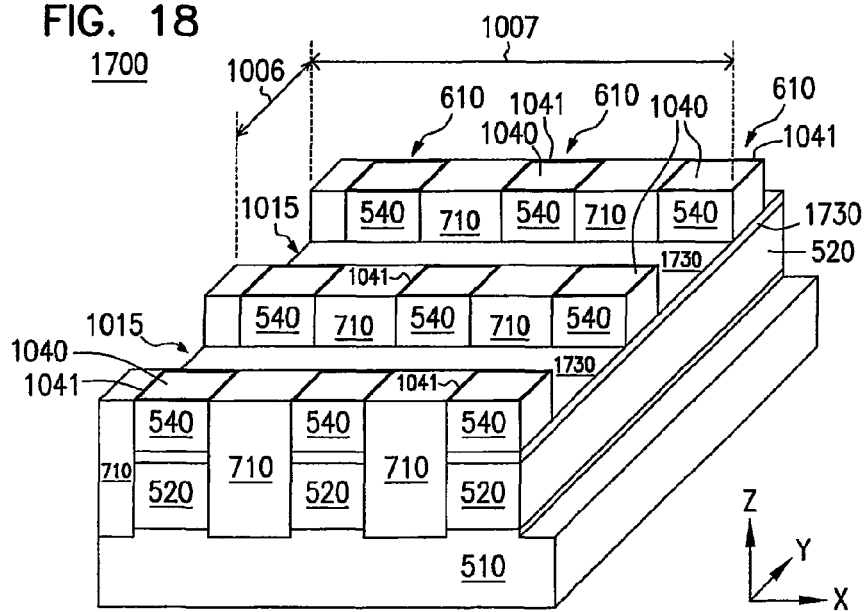
Figure 19:
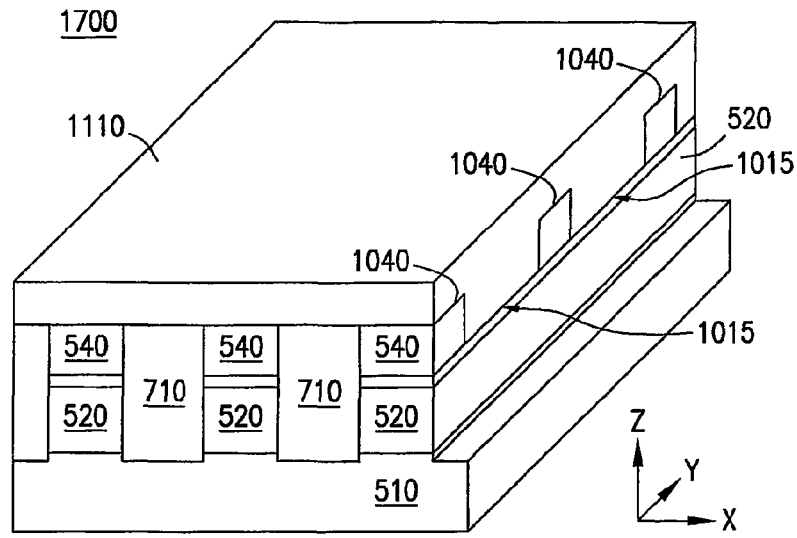
Figure 20:
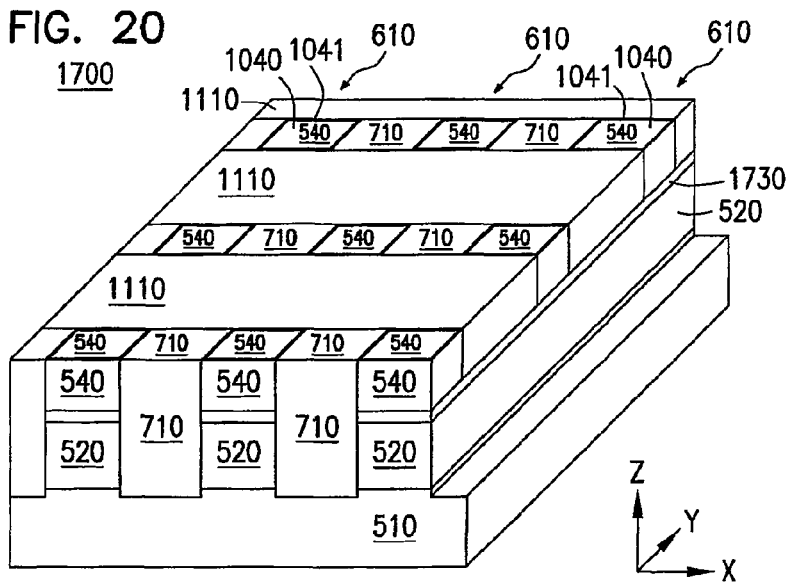
Figure 21:
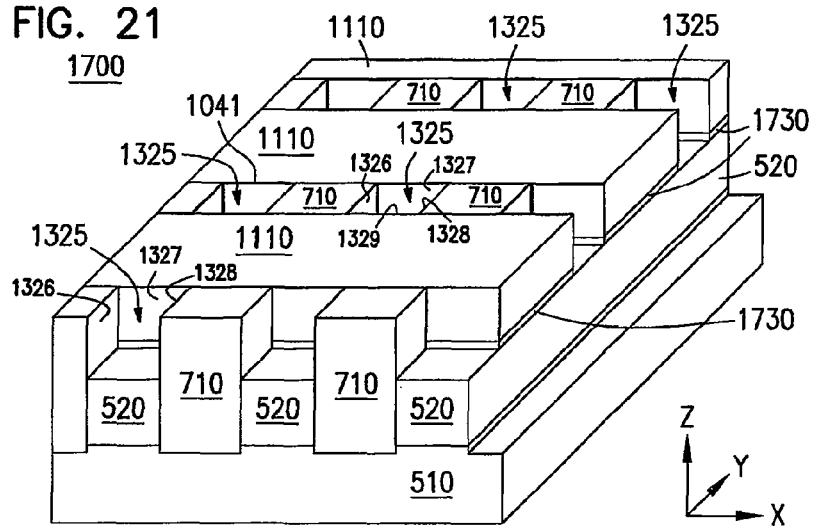
Figure 22:
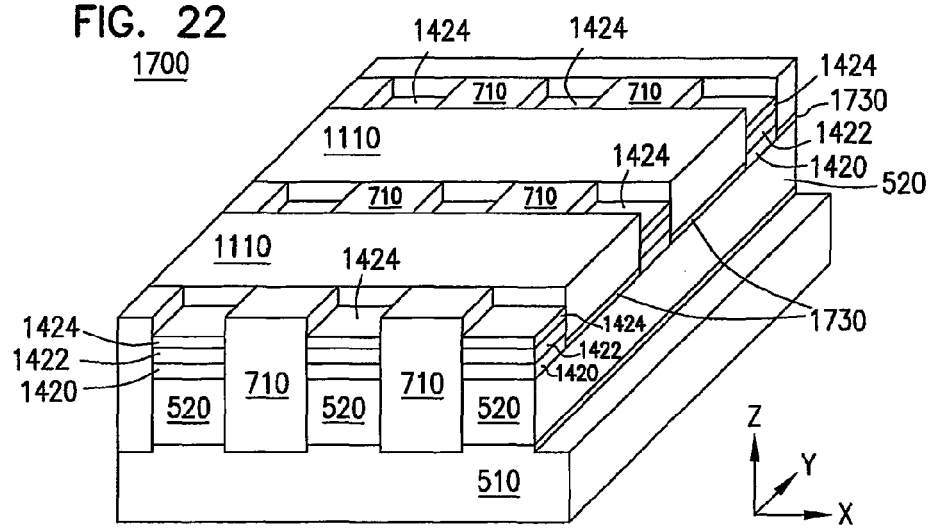
Figure 23:
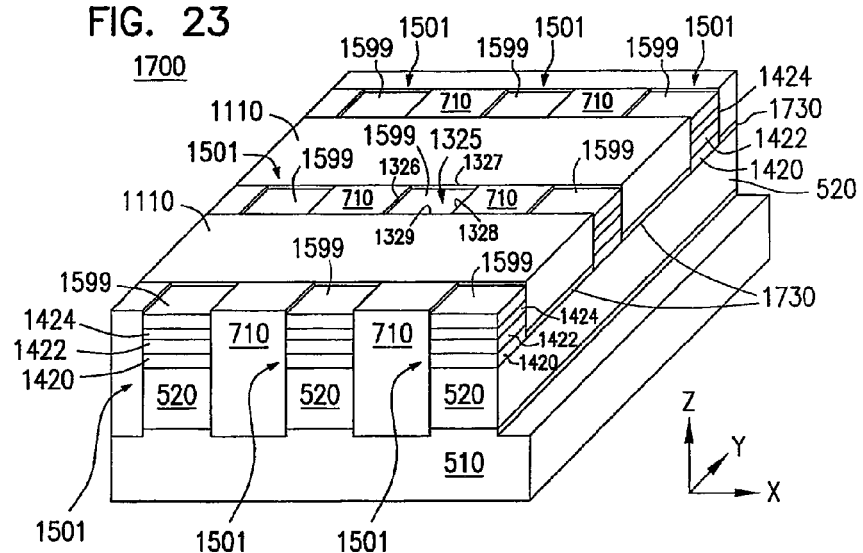
Figure 24:
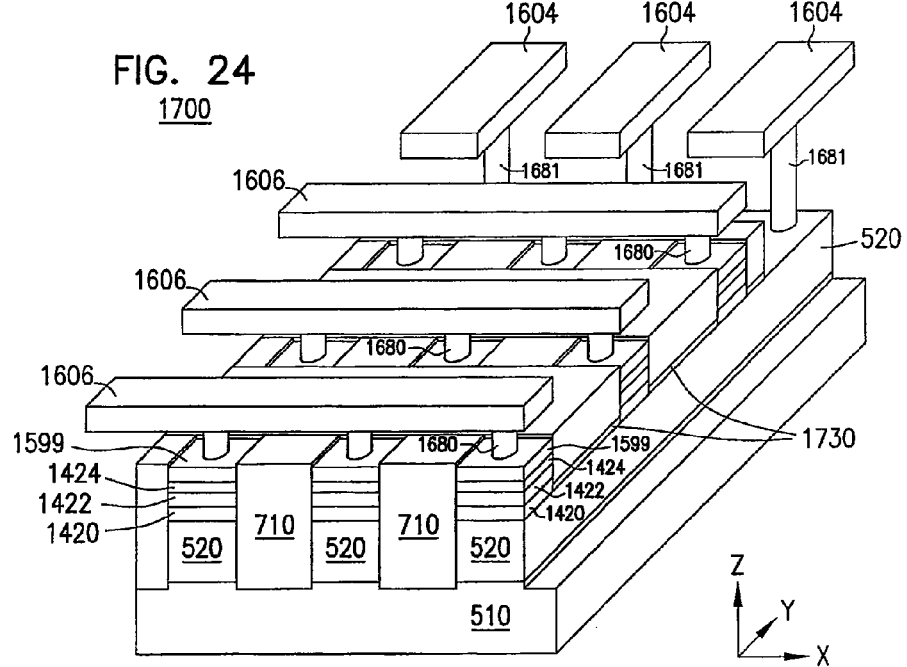

FIG. 18 shows memory device 1700 after trenches 1015 have been formed and masking structure 950 (FIG. 17) has been removed. A removal process such as etching (e.g., dry etch or wet etch) may be used to remove portions of material 540 of each device structure 610 at openings 952 (FIG. 17) and portions of material 710 at openings 952 to form trenches 1015. Material 1730 is not removed. Thus, each trench 1015 has a bottom on material 1730. Each trench 1015 has a width 1006 extending in the y-direction and a length 1007 extending in the x-direction.

In FIG. 19 through FIG. 24, processes similar to those described above with reference to FIG. 11 through FIG. 16 may be used to form other features of memory device 1700. However, as shown FIG. 19 through FIG. 24, only some portions of material 1730 is removed, and some other portions of materials 1730 that are between adjacent memory cells remain in memory device 1700. The presence of material 1730 in memory device 1700 may improve memory device 1700 in ways similarly to material 317 in memory device 300 of FIG. 4.

FIG. 25 through FIG. 29 show processes of forming a memory device 2500 with recesses having different sidewall materials, according to an embodiment of the invention. Some of the processes used to form memory device 500 described above with reference to FIG. 5 through FIG. 16 may be used to from memory device 2500 described herein with reference to FIG. 25 through FIG. 29. Thus, for simplicity, similar materials and features between memory device 500 of FIG. 5 through FIG. 16 and memory device 2500 of FIG. 25 through FIG. 29 are given the same reference numbers.

Figure 25:
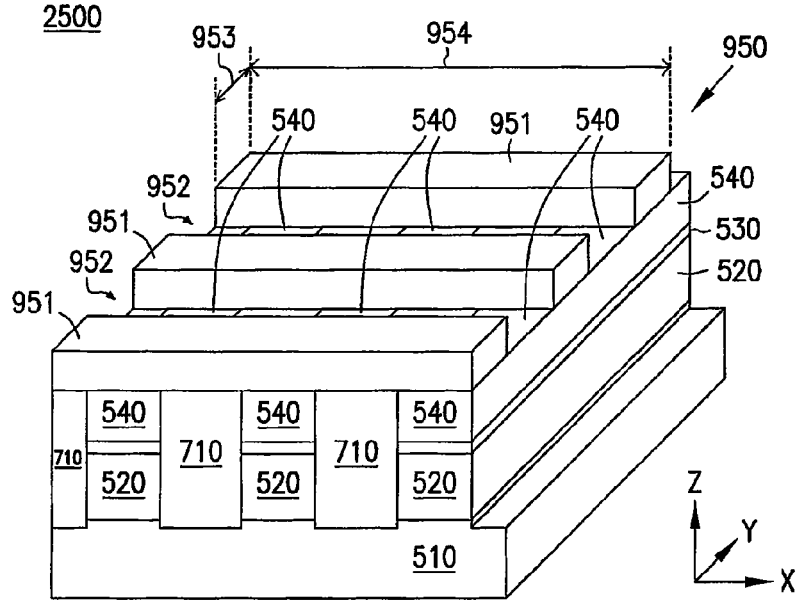

In FIG. 25, the structure of memory device 2500 up to this point may be formed using processes similar to those described above with reference to FIG. 5 through FIG. 9. As shown in FIG. 25, masking structure 950 has been formed. Masking structure 950 has a pattern defined by masking portions 951 and openings 952 with width 953 and length 954.

Figure 26:
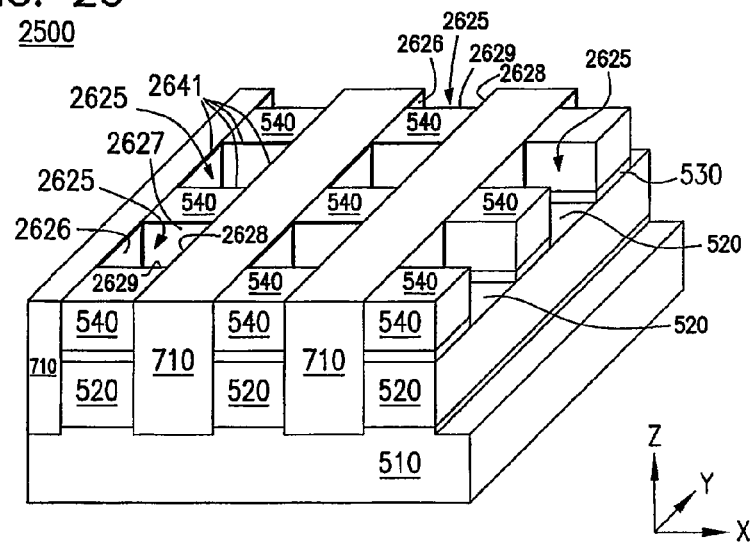

FIG. 26 shows memory device 2500 after recesses 2625 have been formed and masking structure 950 (FIG. 25) has been removed. Unlike the process associated with FIG. 9 where both materials 540 and 710 at openings 952 (FIG. 9) would be removed to form trenches 1015 (FIG. 10), the process (e.g., dry etch or wet etch) associated with FIG. 25 removes only material 540 at openings 952 (FIG. 25) to form recesses 2625 of FIG. 26. Material 710 at openings 952 in FIG. 25 may remain in memory device 2500 when material 540 at openings 952 is removed.

As shown in FIG. 26, each recess 2625 includes a bottom on material 520 and an opening that is shaped by a perimeter 2641 including edges of materials 710 and 540. Since each recess 2625 is surrounded with materials 710 and 540 that are formed using masking structures (e.g., 550 of FIG. 5 and 950 of FIG. 25) with patterns that are positioned perpendicularly to each other, perimeter 2641 may have a polygonal shape. Thus, the opening (shaped by perimeter 2641) of each recess 2625 may also have a polygonal shape.

Since each recess 2625 is surrounded with materials 710 and 540 that are formed using masking structures (e.g., 550 of FIG. 5 and 950 of FIG. 25) with patterns that are positioned perpendicularly to each other, each recess 2625 may also have a polygonal sidewall that may be defined by four sidewall portions 2626, 2627, 2628, and 2629. As shown in FIG. 26, sidewall portions 2626 and 2628 are opposite from each other and are formed form material 710. Sidewall portions 2627 and 2629 are opposite from each other and are formed form material 540. Since material 710 (e.g., silicon oxide) and material 540 (e.g., silicon nitride) may include different materials, the sidewall of each recess 2625 may also include different materials. For example, both sidewall portions 2626 and 2628 may include material 710 (e.g., silicon oxide) and both sidewall portions 2627 and 2629 may include material 540 (e.g., silicon nitride). Features of a memory cell, such as a diode and memory element, may be formed in each recess 2625.

Figure 27:
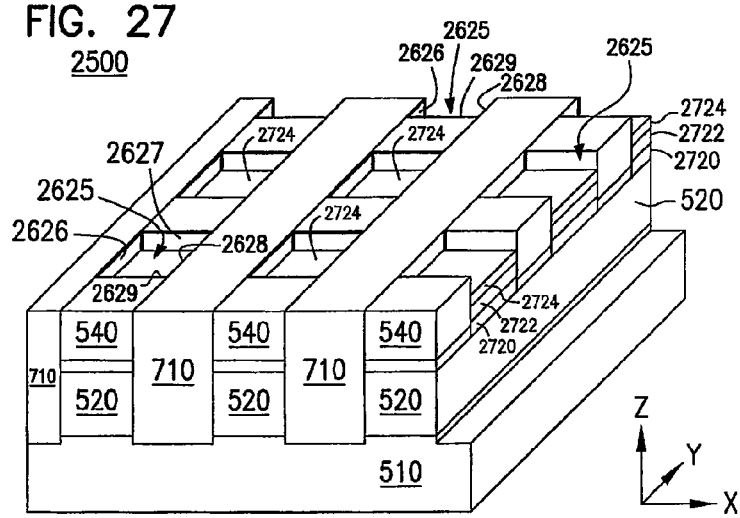

FIG. 27 shows memory device 2500 after materials 2720, 2722, and 2724 have been formed in recesses 2625. Materials 2720, 2722, and 2724 may be formed by processes similar to processes used to form materials 1420, 1422, and 1424, respectively, of FIG. 14. Materials 2720 and 2722 may form at least a portion of a diode. Material 2724 may include conductive material such as material 324 of FIG. 3. As shown in FIG. 27, materials 2720 and 2722 may directly contact materials 710 and 540 at sidewall portions 2626, 2627, 2628, and 2629.

FIG. 28 shows memory device 2500 after a material 2899 has been formed in recesses 2625. Material 2899 may directly contact materials 710 and 540 at sidewall portions 2626, 2627, 2628, and 2629. Material 2899 may be formed by processes similar to processes used to form material 1599 of FIG. 15. Material 2899 may form memory elements of memory cells 2801.

Each memory cell 2801 may include a diode that is formed by at least materials 2720 and 2722, and a memory element that includes material 2899. Since materials 2720 and 2722 in each recess 2625 are formed within the same recess, these materials can be self-aligned to the sidewall of recess 2625 (sidewall defined by sidewall portions 2626, 2627, 2638, and 2629). Thus, in each memory cell 2801, the diode formed by materials 2720 and 2722 can be considered as self-aligned diode.

FIG. 29 shows memory device 2500 after additional features of memory device 2500 have been formed. For example, conductive contacts 2980 and 2981 and conductive lines 2904 and 2906 have been formed. Conductive lines 2904 and conductive lines 2906 may correspond to conductive lines 204 and conductive lines 206, respectively, of FIG. 2. Conductive lines 2904 and conductive lines 2906 of FIG. 29 may also correspond to conductive lines 304 and conductive lines 306, respectively, of FIG. 3.

FIG. 30 through FIG. 39 show processes of forming a memory device 3000 with epitaxial silicon formed before diode formation, according to an embodiment of the invention. Some of the processes used to form memory device 500 described above with reference to FIG. 5 through FIG. 16 may be used to from memory device 3000 described herein with reference to FIG. 30 through FIG. 39. Thus, for simplicity, similar materials and features between memory device 500 of FIG. 5 through FIG. 16 and memory device 3000 of FIG. 30 through FIG. 39 are given the same reference numbers.

In FIG. 30, the structure of memory device 3000 up to this point may be formed using processes similar to those described above with reference to FIG. 5 through FIG. 8. As shown in FIG. 30, device structures 610 insulated by material 710 have been formed.

FIG. 31 shows memory device 3000 after materials 540 and 530 (FIG. 30) have been removed by a process such as etching (e.g., dry etch or wet etch). The removal of materials 540 and 530 forms trenches 3135 extending in the y-direction.

Figure 32:
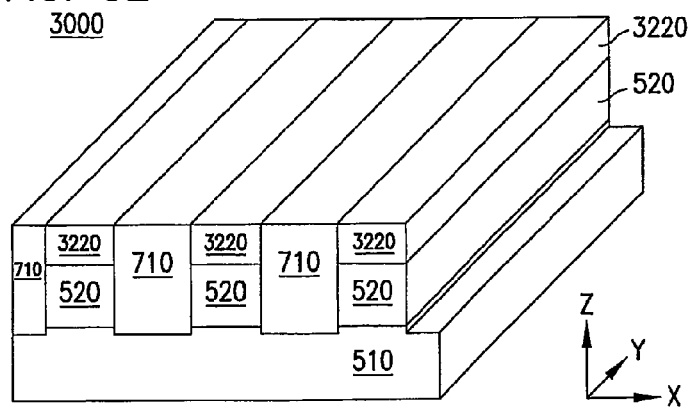

FIG. 32 shows memory device 3000 after material 3220 has been formed in trenches 3135 (FIG. 31). Material 3220 may include n-type semiconductor material (e.g., n-type silicon). Forming material 3220 may include growing epitaxial silicon on material 520. Thus, material 3220 may include single crystalline silicon. Impurities of n-type may be inserted (e.g., in situ doped or implanted) into the grown epitaxial silicon such that material 3220 may include n-type epitaxial silicon. A process (e.g., CMP) may be performed to planarize material 3220 to achieve the structure shown in FIG. 32.

Figure 33:
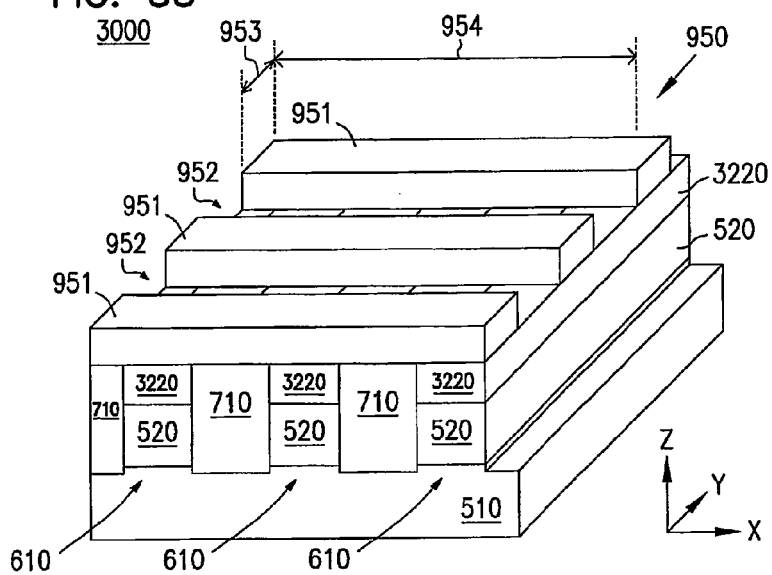

FIG. 33 shows memory device 3000 after a masking structure 950 has been formed over material 3220 and 710. As shown in FIG. 33, masking structure 950 has a pattern defined by masking portions 951 and openings 952 with width 953 and length 954.

Figure 34:
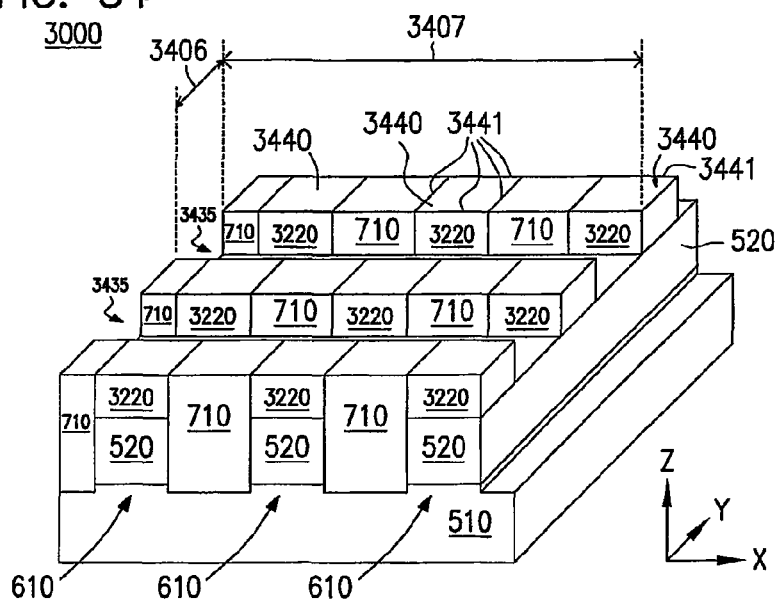

FIG. 34 shows memory device 3000 after trenches 3435 have been formed and masking structure 950 of FIG. 33 has been removed. A removal process such as etching (e.g., dry etch) may be used to remove portions of materials 3220 of each device structure 610 at openings 952 and portions of material 710 at openings 952 to form trenches 3435. Each trench 3435 may have a bottom on material 520, a width 3406 extending in the y-direction, and a length 3407 extending in the x-direction. Length 3407 is substantially greater than width 1006. As shown in FIG. 34, the greater dimension (length 3407) of each trench 3435 extends in the x-direction through device structures 610 to form protrusions 3440 having a perimeter 3441. Since protrusions 3440 are formed using masking structures 550 (FIG. 5) and 950 (FIG. 9) with patterns that are positioned perpendicularly to each other, perimeter 3441 of FIG. 34 may have a polygonal shape.

Figure 35:
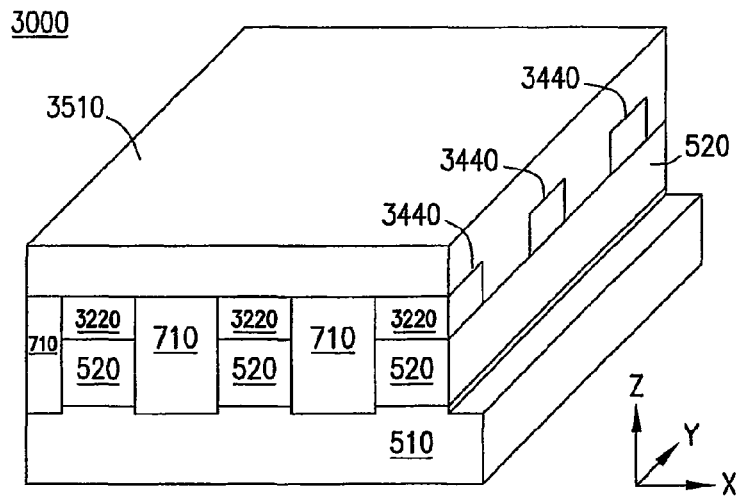

FIG. 35 shows memory device 3000 after a material 3510 has been formed, e.g., by deposition, to fill trenches 3435 to insulate protrusions 3440 from each other in the y-direction. Material 3510 may include insulation material, e.g., silicon oxide or other insulation material. Material 3510 may include the same material composition as that of material 710. For example, both materials 3510 and 710 may include silicon oxide.

Figure 36:
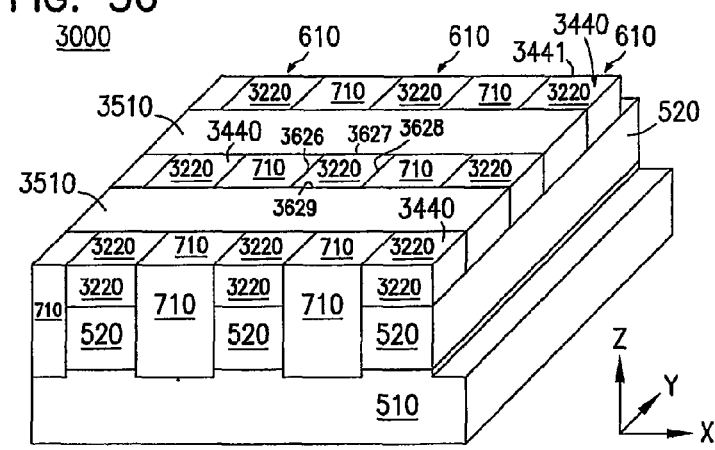

FIG. 36 shows memory device 3000 after material 3510 has been planarized, e.g., through CMP or etch back to expose material 3320 of protrusions 3440. As shown in FIG. 36, protrusions 3440 along the y-direction of the same device structure 610 are insulated from each other by material 3510, and protrusions 3440 along the x-direction between different device structures 610 are insulated from each other by material 710.

Each protrusion 3440 includes a bottom on material 520 and an opening that is shaped by perimeter 3441. As shown in FIG. 36, each protrusion 3440 includes perimeter 3441 surrounded by materials 3510 and 710 and includes a bottom on material 520. Since each protrusion 3440 is formed using masking structures (e.g., 550 of FIG. 5 and 950 of FIG. 9) with patterns that are positioned perpendicularly to each other perimeter 3441 may have a polygonal shape.

As shown in FIG. 36, each protrusion 3440 also includes a sidewall defined by four sidewall portions 3626, 3627, 3628, and 3629. Since each protrusion 3440 is formed using masking structures (e.g., 550 of FIG. 5 and 950 of FIG. 9) with patterns that are positioned perpendicularly to each other, each protrusion 3440 may also have a polygonal sidewall defined by sidewall portions 3626, 3627, 3628, and 3629, which are surrounded by materials 3510 and 710. Features of a memory cell, such as a diode may be formed in each protrusion 3340.

Figure 37:
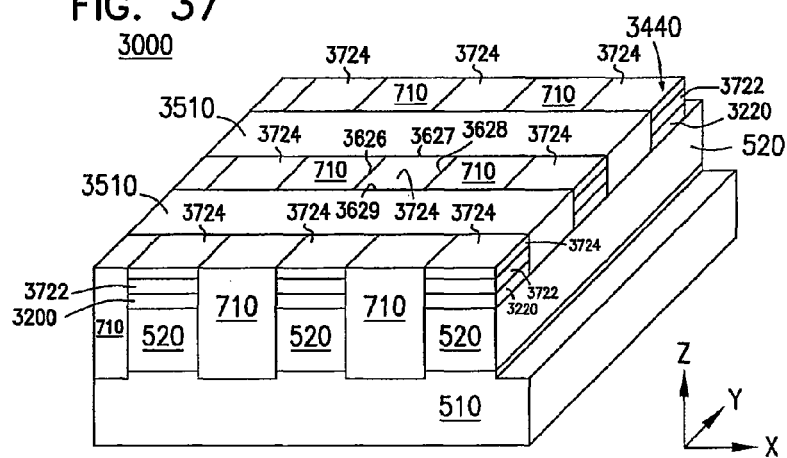

FIG. 37 shows memory device 3000 after materials 3722 and 3724 have been formed in protrusions 3440. Materials 3220 and 3722 may directly contact materials 710 and 3510 at sidewall portions 3636, 3637, 3628, and 3629. Material 3722 may include p-type semiconductor material (e.g., p-type silicon). Materials 3220 and 3722 may form at least a part of a diode. Material 3724 may include conductive material with a resistivity lower than the resistivity of materials 3220 and 3722. Material 3724 may include a material 324 of FIG. 3. Forming materials 3722 and 3724 may include inserting (e.g., implanting) p-type impurities into material 3220 to form material 3722 and performing a silicidation process after the p-type impurity is inserted into material 3722 to form material 3724.

Figure 38:
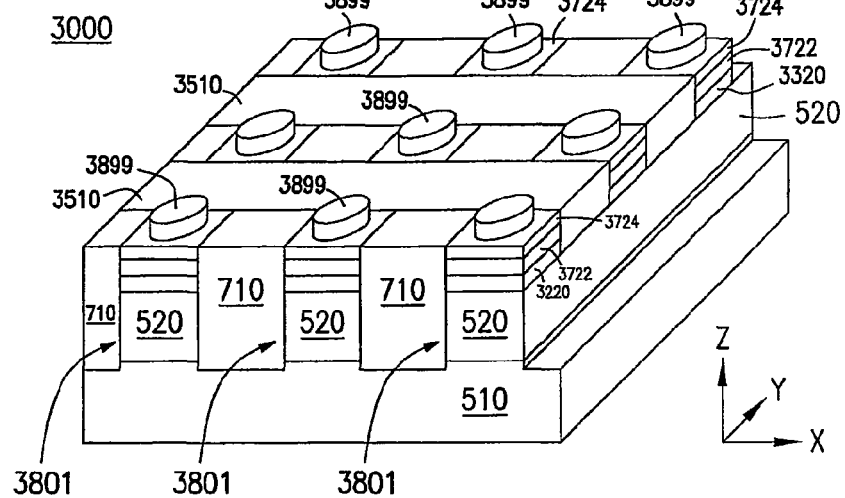

FIG. 38 shows memory device 3000 after material 3899 has been formed. FIG. 38 shows each material 3899 having a cylindrical structure as an example. Material 3899 may be formed with a different structure. Forming material 3899 may include depositing a chalcogenide material over material 3724 followed by an additional process (e.g., dry etch) to form material 3899. A conductive material may be formed over the chalcogenide material before the additional process that forms material 3899 is performed, so that material 3899 can be protected during the additional process. Alternatively, forming material 3899 may include depositing an insulation material over materials 710, 3510, and 3724, forming vias in the insulation material, and then depositing material 3899 into the vias. For clarity, FIG. 38 omits the insulation material and the vias. Material 3899 may form memory elements of memory cells 3801.

Figure 39:
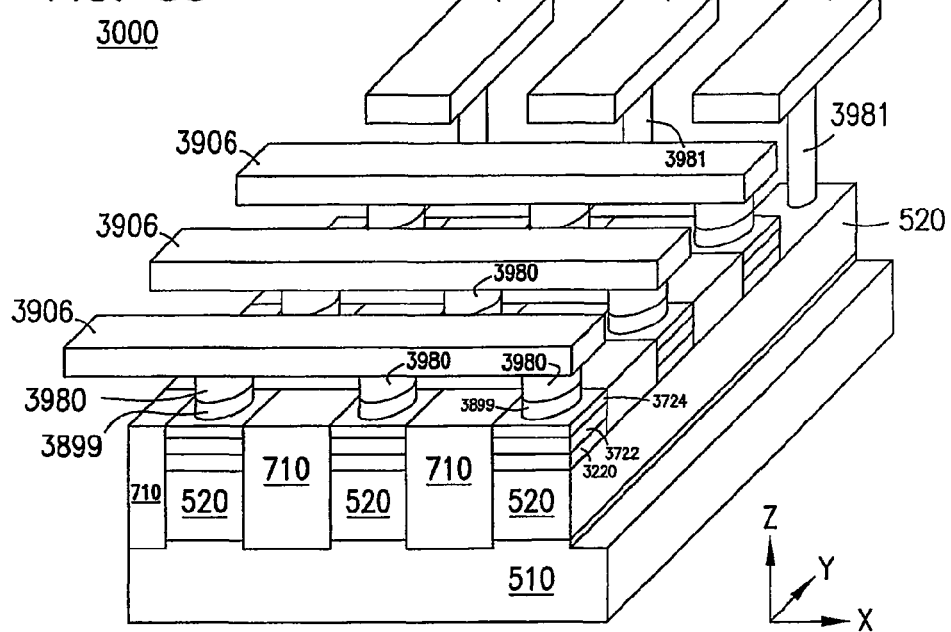

FIG. 39 shows memory device 3000 after additional features of memory device 3000 have been formed. For example, conductive contacts 3980 and 3981 and conductive lines 3904 and 3906 have been formed. In some cases, material for at least a portion (e.g., bottom portion) of conductive contacts 3980 may be formed in the same vias (described above with reference to FIG. 38) where material 3899 is formed. In FIG. 39, conductive lines 3904 and lines 3906 may correspond to conductive lines 204 and conductive lines 206, respectively, of FIG. 2. Conductive lines 3904 and conductive lines 3906 of FIG. 39 may also correspond to conductive lines 304 and conductive lines 306, respectively, of FIG. 3.

FIG. 40 through FIG. 49 show processes of forming a memory device 4000 without forming epitaxial silicon to form diodes of the memory device, according to an embodiment of the invention. Some of the processes used to form memory device 500 described above with reference to FIG. 5 through FIG. 16 may be used to from memory device 4000 described herein with reference to FIG. 40 through FIG. 49. Thus, for simplicity, similar materials and features between memory device 500 of FIG. 5 through FIG. 16 and memory device 4000 of FIG. 40 through FIG. 49 are given the same reference numbers.

Figure 40:
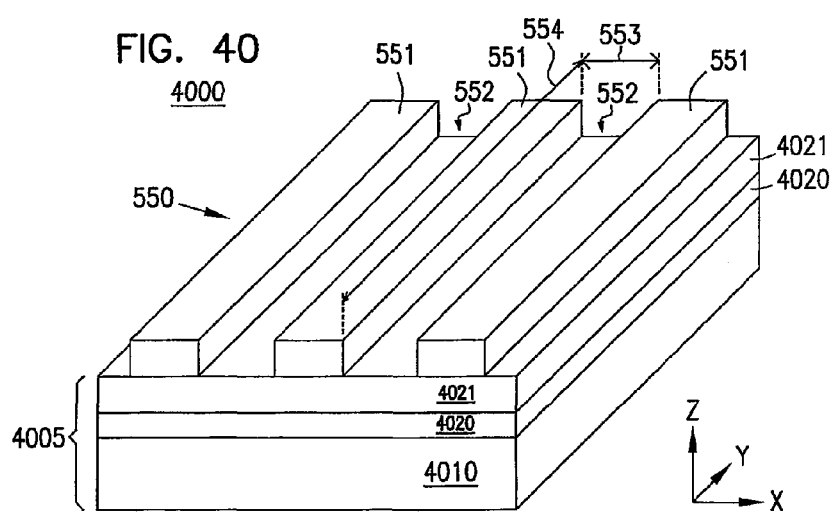
FIG. 40 through FIG. 49 show processes of forming a memory device without forming epitaxial silicon to form diodes of the memory device, according to an embodiment of the invention.

FIG. 40 shows memory device 4000 having a substrate 4005 and multiple materials 4010, 4020, and 4021 formed in or over substrate 4005. Substrate 4005 may initially include p-type semiconductor (e.g., silicon) material. Forming material 4020 and 4021 may include inserting (e.g., implanting) n-type impurities into a portion (e.g., top portion) of substrate 4005. Thus, material 4020 and 4021 may include an n-type semiconductor material. The remaining portion (e.g., bottom portion) of substrate 4005, which includes material 4010, that has not been inserted with n-type impurities may remain a p-type semiconductor material.

Different concentration of n-type impurities may be used such that materials 4020 and 4021 may have different impurity implantation (or doping). For example, the concentration of n-type impurities may be controlled such that material 4020 may have a greater impurity concentration than that of material 4021.

FIG. 40 also shows an x-direction, a y-direction perpendicular to the x-direction, and a z-direction perpendicular to both the x-direction and the y-direction. As shown in FIG. 40, materials 4010, 4020, and 4021 may form different layers, one layer over (or on) one or more other layers with respect to the z-direction.

FIG. 40 also shows a masking structure 550 formed over materials 4010, 4020, and 4021. As shown in FIG. 40, masking structure 550 has a pattern defined by masking portions 551 and openings 552 with width 553 and length 554.

Figure 41:
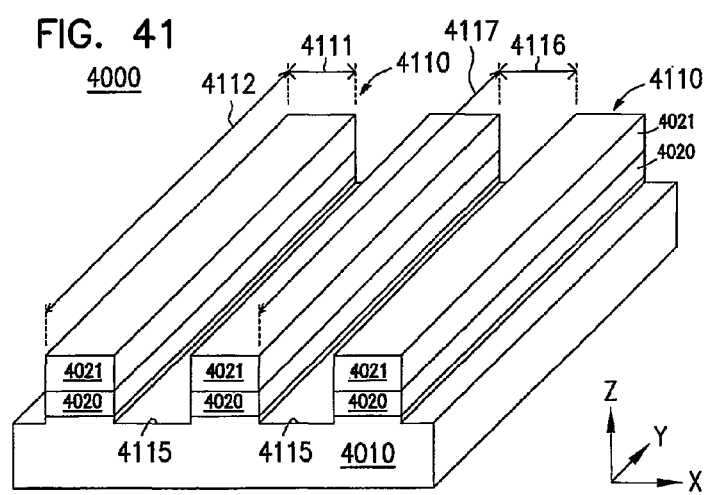

FIG. 41 shows memory device 4000 after device structures 4110 and trenches 4115 have been formed and masking structure 550 (FIG. 40) has been removed. A process such as etching (e.g., dry etch) may be used to remove portions of materials 4021, 4020, and 4010 at openings 552 (FIG. 40). The remaining portions of materials 4021, 4020, and 4010 (portions underneath masking portions 551) form device structures 4110. Each device structure 4110 has a width 4111 extending in the x-direction and a length 4112 extending in the y-direction. Length 4112 is substantially greater than width 4111. Each trench 4115 may have a bottom on material 4010, a width 4116 extending in the x-direction, and a length 4117 extending in the y-direction. Length 4117 is substantially greater than width 4116.

Figure 42:
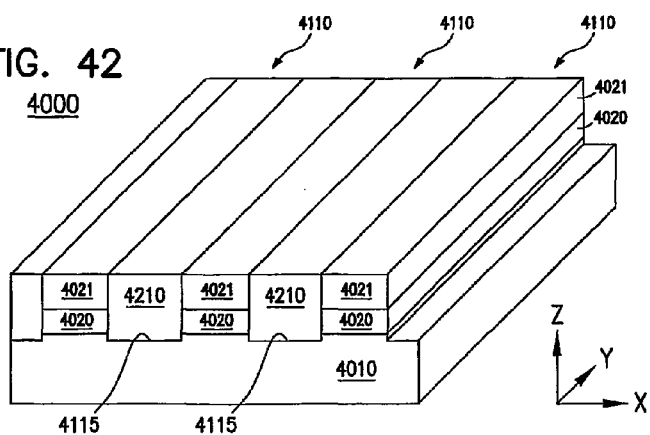

FIG. 42 shows memory device 4000 after a material 4210 has been formed, e.g., by deposition, to fill trenches 4115 to insulate device structures 4110 from each other. Material 4210 may include insulation material, e.g., silicon oxide or other insulation material. A process, such as CMP, may be used to planarize material 4210 after it is formed to obtain the structure of memory device 4000 of FIG. 42.

Figure 43:
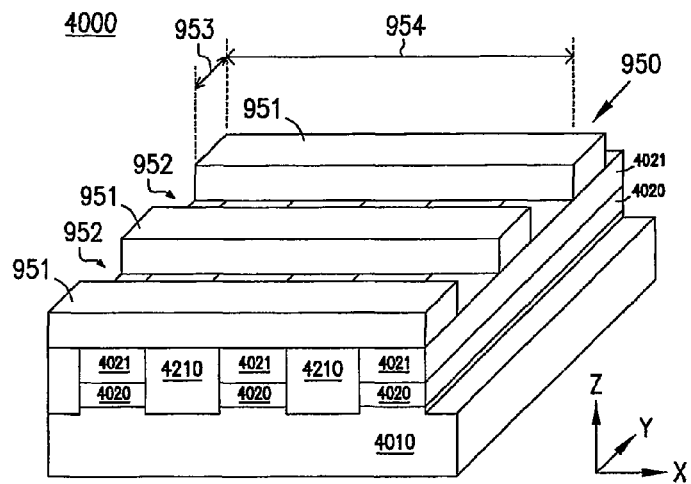

FIG. 43 shows memory device 4000 after a masking structure 950 has been formed over device structures 4110 and material 4210. As shown in FIG. 43, masking structure 950 includes a pattern defined by masking portions 951 and openings 952 with width 953 and length 954.

Figure 44:
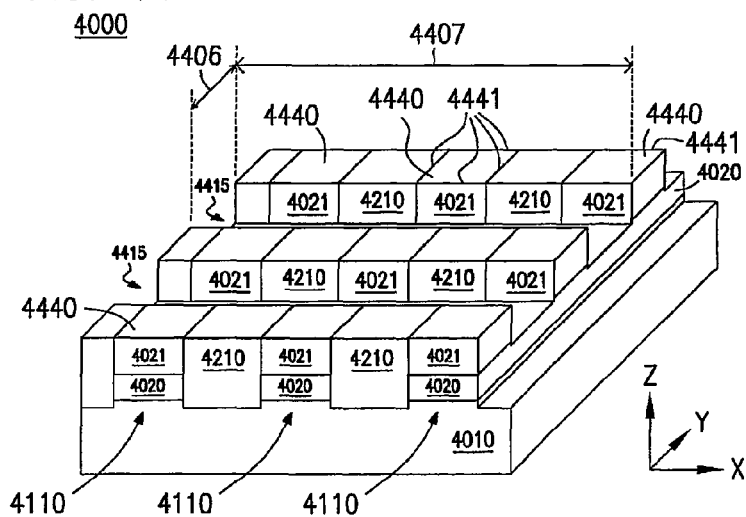

FIG. 44 shows memory device 4000 after trenches 4415 have been formed and masking structure 950 (FIG. 43) has been removed. A removal process such as etching (e.g., dry etch) may be used to remove portions of material 4210 at openings 952 and a portion of material 4021 or portions of each of materials 4021 and 4020 at openings 952 and to form trenches 4415 in FIG. 44. Each trench 4415 may have a bottom on material 4020, a width 4406 extending in the y-direction, and a length 4407 extending in the x-direction. Length 4407 is substantially greater than width 4406. As shown in FIG. 44, the greater dimension (length 4407) of each trench 4415 extends in the x-direction through device structures 4110 to form protrusions 4440 having a perimeter 4441. Since protrusions 4440 are formed using masking structures 550 (FIG. 5) and 950 (FIG. 9) with patterns that are positioned perpendicularly to each other, perimeter 4441 of FIG. 44 may have a polygonal shape.

Figure 45:
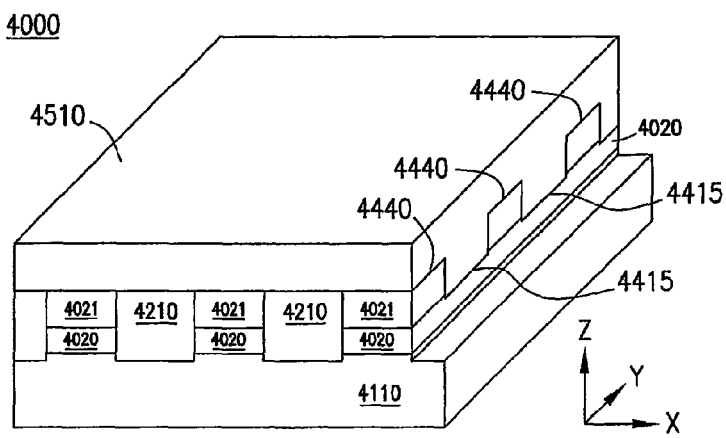

FIG. 45 shows memory device 4000 after a material 4510 has been formed, e.g., by deposition, to fill trenches 4415 to insulate protrusions 4440 from each other in the y-direction. Material 4510 may include insulation material, e.g., silicon oxide or other insulation material. Material 4510 may include the same material composition as that of material 4210. For example, both materials 4510 and 4210 may include silicon oxide.

Figure 46:
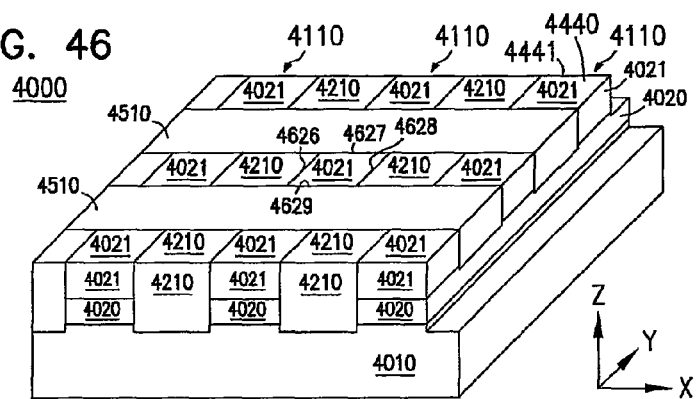

FIG. 46 shows memory device 4000 after material 4510 has been planarized, e.g., through CMP or etch back to expose material 4021 of protrusions 4440. As shown in FIG. 46, protrusions 4440 along the y-direction of the same device structures 4110 are insulated from each other by material 4510, and protrusions 4140 along the x-direction between different device structures 4110 are insulated from each other by material 4210.

Each protrusion 4440 includes a bottom on material 4020 and an opening that is shaped by perimeter 4441. As shown in FIG. 46, each protrusion 4440 includes perimeter 4441 surrounded by materials 4510 and 4210 and includes a bottom on material 4020. Since each protrusion 4440 is formed using masking structures (e.g., 550 of FIG. 40 and 950 of FIG. 43) with patterns that are positioned perpendicularly to each other perimeter 4441 may have a polygonal shape.

Each protrusion also includes a sidewall defined by four sidewall portions 4626, 4627, 4628, and 4629. Since each protrusion 4440 is formed using masking structures (e.g., 550 of FIG. 40 and 950 of FIG. 43) with patterns that are positioned perpendicularly to each other, each protrusion 4440 may also have a polygonal sidewall defined by sidewall portions 4626, 4627, 4628, and 4629, which are surrounded by materials 4510 and 4210. Features of a memory cell, such as a diode may be formed in each protrusion 4440.

Figure 47:
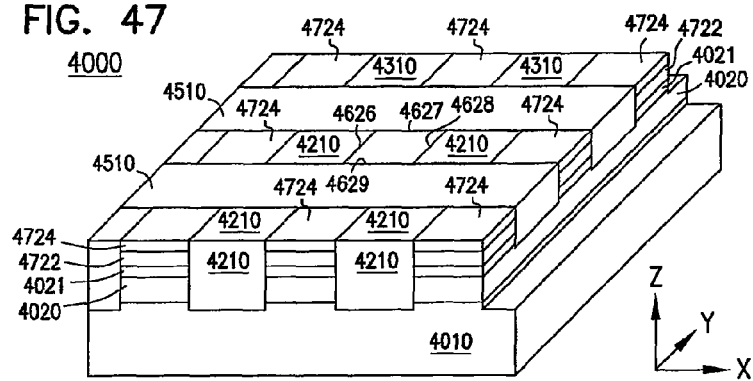

FIG. 47 shows memory device 4000 after materials 4722 and 4724 have been formed in protrusions 4440. Materials 4722 and 4724 may directly contact materials 4210 and 4510 at sidewall portions 4646, 4647, 4628, and 4629. Material 4722 may include p-type semiconductor material (e.g., p-type silicon). Materials 4021 and 4722 may form at least a part of a diode. Material 4724 may include conductive material with a resistivity lower than the resistivity of materials 4021 and 4722. Material 4724 may include conductive material such as material 324 of FIG. 3. Forming materials 4722 and 4724 may include inserting (e.g., implanting) p-type impurities into material 4021 to form material 4722 and performing a silicidation process after the p-type impurity is inserted into material 4021 to form material 4724.

Figure 48:
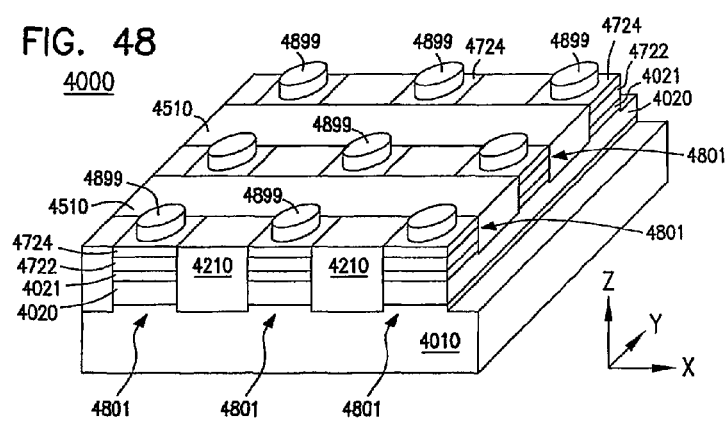

FIG. 48 shows memory device 4000 after material 4899 has been formed. FIG. 48 shows each material 4899 having a shape with a cylindrical structure as an example. Material 4899 may be formed with a different structure. Forming material 4899 may include depositing a chalcogenide material over material 4724 followed by an additional process (e.g., dry etch) to form material 4899. A conductive material may be formed over the chalcogenide material before the additional process that forms material 4899 is performed, so that material 4899 can be protected during the additional process.

Alternatively, forming material 4899 may include depositing an insulation material over materials 4210, 4510, and 4724, forming vias in the insulation material, and then depositing material 4899 into the via. For clarity, FIG. 48 omits the insulation material and the vias. Material 4899 may form memory elements of memory cells 4801.

Figure 49:
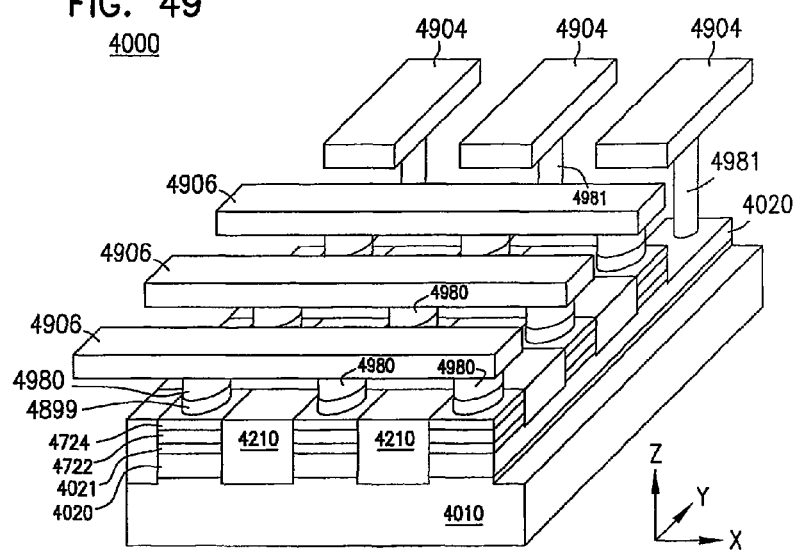

FIG. 49 shows memory device 4000 after additional features of memory device 4000 have been formed. For example, conductive contacts 4980 and 4981 and conductive lines 4904 and 4906 have been formed. In some cases, material for at least a portion (e.g., bottom portion) of conductive contacts 4980 may be formed in the same vias (described above with reference to FIG. 48) where material 4899 is formed. Conductive lines 4904 and conductive lines 4906 may correspond to conductive lines 204 and conductive lines 206, respectively, of FIG. 2. Conductive lines 4904 and conductive lines 4906 of FIG. 49 may also correspond to conductive lines 304 and conductive lines 306, respectively, of FIG. 3.

FIG. 50 through FIG. 58 show processes of forming a memory device 5000 with conductive materials simultaneously formed over diodes and between diodes of the memory device, according to an embodiment of the invention. Some of the processes used to form memory device 500 (FIG. 5 through FIG. 16) and memory device 2500 (FIG. 25 and FIG. 26) may be used to form memory device 5000 described herein with reference to FIG. 50 through FIG. 58. Thus, for simplicity, similar materials and features among memory device 500 (FIG. 5 through FIG. 16), memory device 2500 (FIG. 25 and FIG. 26), and memory device 5000 of FIG. 50 through FIG. 58 are given the same reference numbers.

Figure 50:
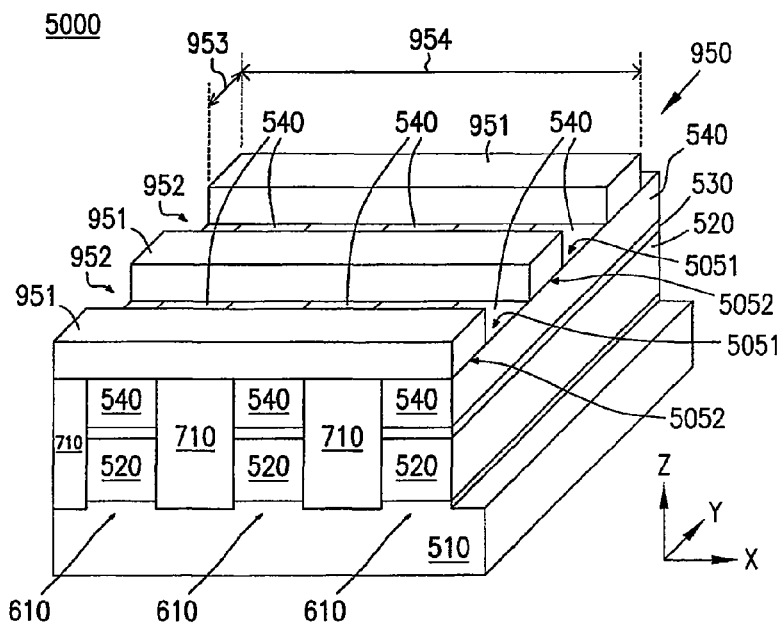

In FIG. 50, the structure of memory device 5000 up to this point may be formed using processes similar to those described above with reference to FIG. 25. As shown in FIG. 50, masking structure 950 includes openings 540 such that a first portion 5051 of device structures 610 are exposed at openings 540 and a second portion 5052 of device structures 610 is underneath masking structure 950.

In FIG. 51, the structure of memory device 5000 up to this point may be formed using processes similar to those described above with reference to FIG. 26. As shown in FIG. 51, recesses 2625 have been formed and masking structure 950 (FIG. 50) has been removed. Each recess 2625 includes a bottom on material 520.

FIG. 52 shows memory device 5000 after materials 5220 and 5222 have been formed in recesses 2625. Materials 5220 and 5222 may form at least a portion of a diode. Materials 5220 and 5222 may be formed by processes similar to processes used to form materials 1420 and 1422, respectively, of FIG. 14, such that material 5220 of FIG. 52 may include n-type semiconductor material and material 5222 may include p-type semiconductor material.

Figure 53:
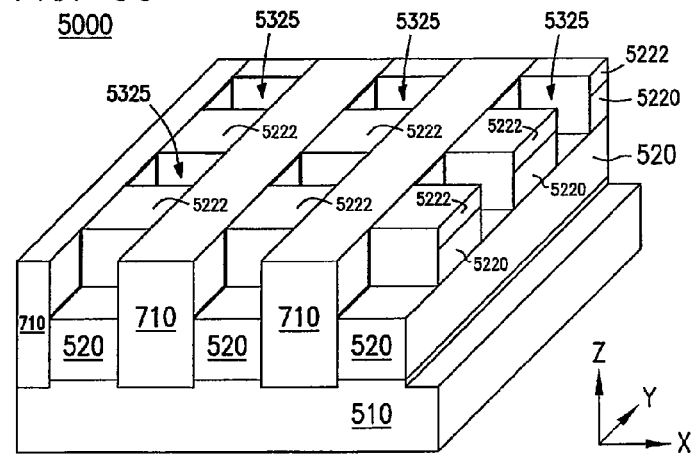

FIG. 53 shows memory device 5000 after materials 540 and 530 (FIG. 52) have been removed by a process such as etching (e.g., dry etch or wet etch). The removal of materials 540 and 530 creates openings 5325.

Figure 54:
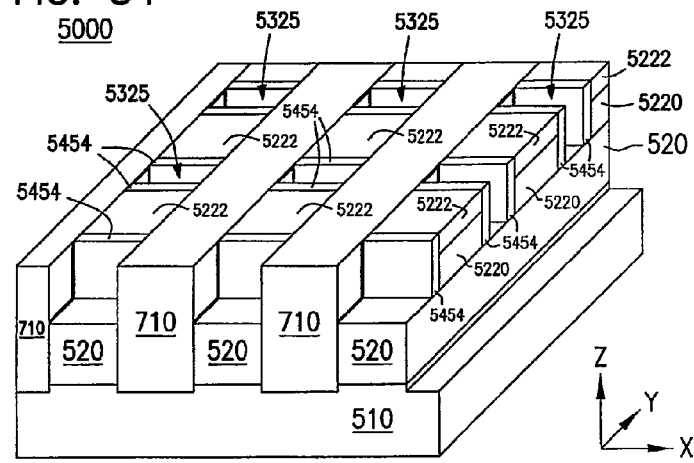

FIG. 54 shows memory device 5000 after spacers 5454 have been formed in openings 5325. Spacers 5454 may include an insulation material, such as a silicon based material (e.g., silicon oxide).

Figure 55:
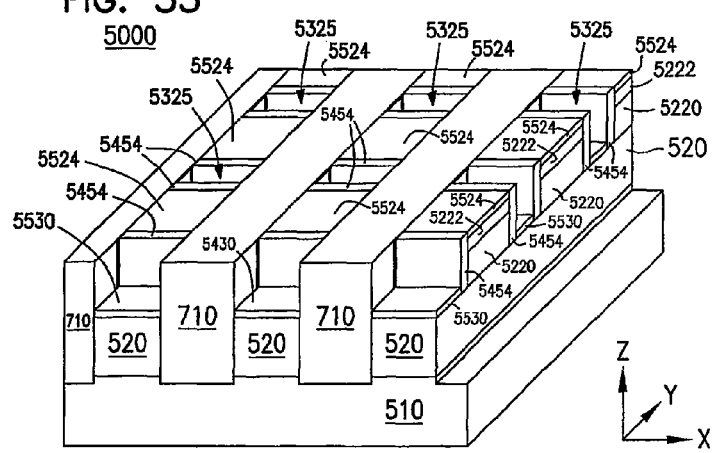

FIG. 55 shows memory device 5000 after conductive materials 5524 and 5530 have been formed. Materials 5524 and 5530 can be the same material and may include a material with a resistivity lower than the resistivity of materials 5220 and 5222. For example, materials 5524 and 5530 may include cobalt silicide or nickel silicide. Since materials 5524 and 5530 can be the same material, they can be formed simultaneously. For example, after spacers 5454 are formed, a silicidation process may be performed to simultaneously form materials 5524 and 5530. Materials 5524 and 5530 may include characteristics similar to those of materials 314 and 317 described above with reference to FIG. 3.

Figure 56:
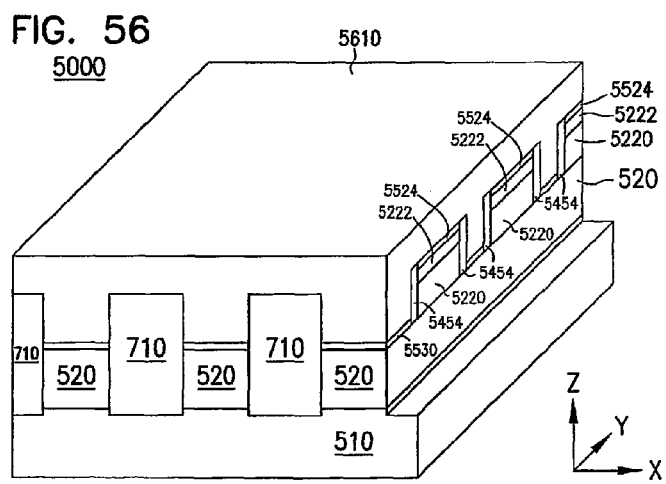

FIG. 56 shows memory device 5000 after a material 5610 has been formed, e.g., by deposition, to fill openings 5325. Material 5610 may include insulation material, e.g., silicon oxide or other insulation material. Material 5610 may include the same material composition as that of material 710. For example, both materials 5610 and 710 may include silicon oxide.

Figure 57:
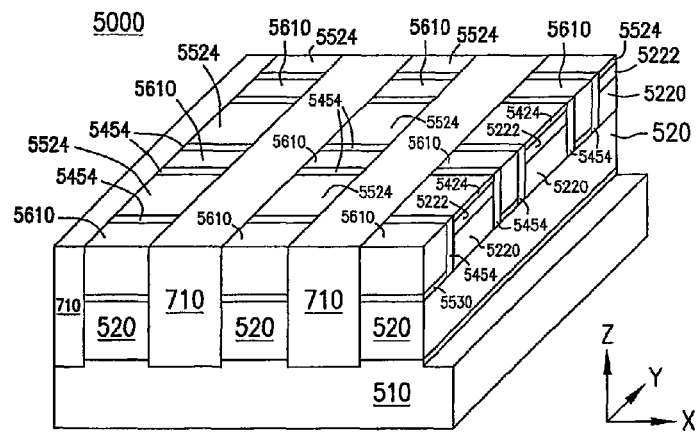

FIG. 57 shows memory device 5000 after material 5610 has been planarized, e.g., through CMP or etch back, to expose spacers 5424 and material 5524.

Figure 58:
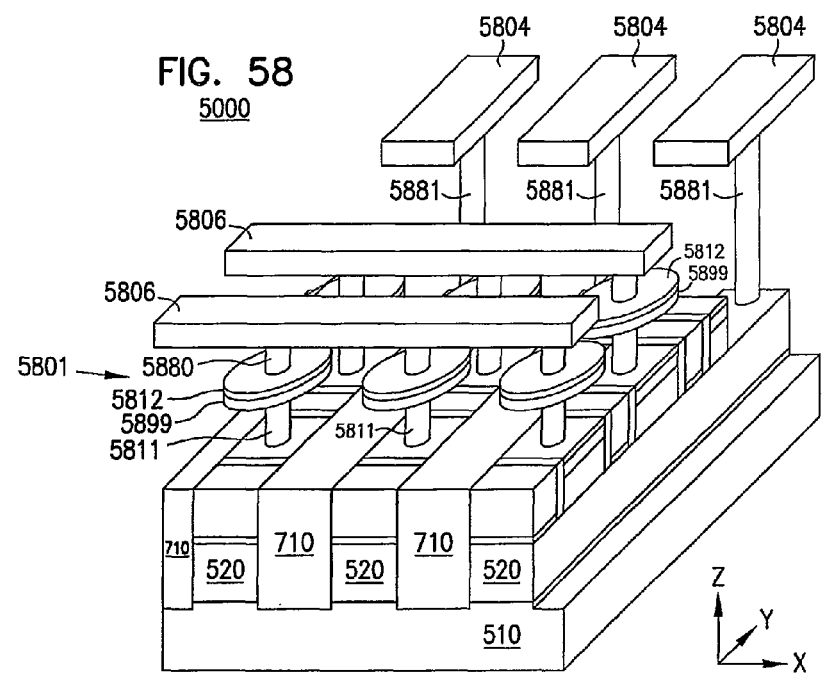

FIG. 58 shows memory device 5000 including memory cells 5801 after formation of additional features of memory device 5000, such as electrodes 5811 and 5812, memory elements 5899, conductive contacts 5880 and 5881, and conductive lines 5804 and 5806. Conductive lines 5804 and conductive lines 5806 may correspond to conductive lines 204 and conductive lines 206, respectively, of FIG. 2. Conductive lines 5804 and conductive lines 5806 of FIG. 58 may also correspond to conductive lines 304 and conductive lines 306, respectively, of FIG. 3. As shown in FIG. 58, each memory cell 5801 may includes a diode formed by at least materials 5220 and 5222, one of electrodes 5811, one of electrodes 5812, one of memory elements 5899, and one of contacts 5880.

Forming electrodes 5811 may include depositing a first insulation material over materials 5424 and 5610, forming vias in the first insulation material, and then depositing a conductive material into the first vias to form electrode 5811. For clarity, FIG. 58 omits the first insulation material and the first vias.

Forming memory element 5899 may include depositing a second insulation material over electrodes 5811, forming second vias in the second insulation material, and then depositing a chalcogenide material into the second vias to form memory elements 5899. For clarity, FIG. 58 omits the second insulation material and the second vias.

Forming electrodes 5812 may include depositing a conductive material over memory elements 5899. Electrodes 5812 can be formed in the same vias (second via described above) where memory elements 5899 are formed. Alternatively, electrodes 5812 and memory elements 5899 can be formed together. For example, forming electrodes 5812 and memory elements 5899 may include depositing a chalcogenide material (to form memory elements 5899) over electrodes 5811 and depositing a conductive material (to form electrodes 5812) over the chalcogenide material. Then, an additional process (e.g., dry etch) may be performed to form individual mesas with each mesa including one memory element 5899 and one electrode 5812. The additional process may alternatively form (e.g., etch) the chalcogenide material and the conductive material into lines (instead of individual mesas) parallel to lines 5806, such that each line includes memory elements 5899 and electrodes 5812 of multiple memory cells.

Contacts 5880 and 5881 and conductive lines 5880 and 5881 may be formed following the formation of electrodes 5812.

Figure 59:
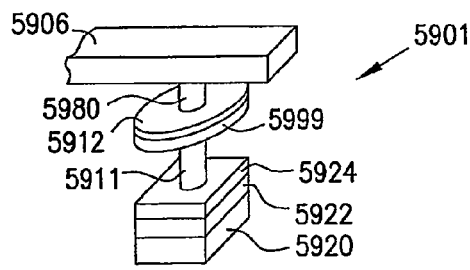
FIG. 59 shows a partial 3D diagram of a memory device including a memory cell, according to an embodiment of the invention.

FIG. 59 shows a partial 3D diagram of a memory device 5900 including a memory cell 5901, according to an embodiment of the invention. Memory device 5900 includes many memory cells arranged in rows and columns similar to the arrangements of the memory cells of the memory devices described above, such as memory device 300 (FIG. 3); memory device 500 (FIG. 16), memory device 1700 (FIG. 24); memory device 2500 (FIG. 29); memory device 3000 (FIG. 39); and memory device 4000 (FIG. 49). However, to focus on the differences between memory device 5900 of FIG. 59 and the other memory devices described above, FIG. 59 shows only one memory cell 5901 and some features of memory device 5900, such as materials 5920, 5922, and 5924; electrodes 5911 and 5912, memory element 5999; conductive contact 5980; and conductive line 5906.

Electrodes 5911 and 5912 and memory element 5999 can be formed with processes similar to processes that form electrodes 5811 and 5812 and memory element 5899 of memory device 5000 of FIG. 58.

Materials 5920 and 5922 may form at least a portion of a diode of memory cell 5901. Materials 5920, 5922, and 5924 of memory device 5900 may correspond to materials 321, 322, and 324, respectively, of memory device 300 of FIG. 3; materials 1420, 1422, and 1424, respectively, of memory device 500 of FIG. 16 and memory device 1700 of FIG. 24; materials 2820, 2822, and 2824, respectively, of memory device 2500 of FIG. 29; materials 3220, 3722, and 3724, respectively, of memory device 3000 of FIG. 29; and materials 4021, 4722, and 4724, respectively, of memory device 4000 of FIG. 49. Thus, materials 5920, 5922, and 5924 of memory device 5900 of FIG. 59 can be formed with processes similar to processes that form the corresponding materials described above.

Some of the features of memory device 5900 shown in FIG. 59 can be substituted for a portion of memory devices 300, 500, 1700, 2500, 3000, and 4000, such that each memory cell in each of memory devices 300, 300, 500, 1700, 2500, 3000, and 4000 described above can have a structure of memory cell 5901 shown in FIG. 59. For example, the features between material 5924 and contact 5980, such as electrodes 5911 and 5912 and memory element 5999 of memory device 5900, can be substituted for memory element 399 of memory device 300 of FIG. 3; memory element 1599 of memory device 500 of FIG. 16 and memory device 1700 of FIG. 24; memory element 2899 of memory device 2500 of FIG. 29; memory element 3899 of memory device 3000 of FIG. 39; or memory element 4899 of memory device 4000 of FIG. 49.

Figure 60:
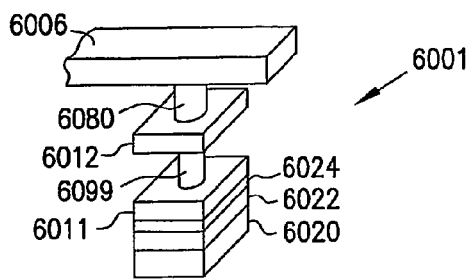
FIG. 60 shows a partial 3D diagram of another memory device including a memory cell, according to an embodiment of the invention.

FIG. 60 shows a partial 3D diagram of a memory device 6000 including a memory cell 6001, according to an embodiment of the invention. Memory device 6000 includes many memory cells arranged in rows and columns similar to the arrangements of the memory cells of the memory devices described above, such as memory device 300 (FIG. 3), memory device 500 (FIG. 16); memory device 1700 (FIG. 24); memory device 2500 (FIG. 29); memory device 3000 (FIG. 39); and memory device 4000 (FIG. 49). However, to focus on the differences between memory device 6000 of FIG. 60 and the other memory devices described above, FIG. 60 shows only one memory cell 6001 and some features of memory device 6000, such as materials 6020, 6022, and 6024, electrodes 6011 and 6012, memory element 6099 (e.g., a chalcogenide material), conductive contact 6080, and conductive line 6006.

Materials 6020 and 6022 may form at least a portion of a diode of memory cell 6001. Materials 6020, 6022, and 6024 of memory device 6000 may correspond to materials 321, 322, and 324, respectively, of memory device 300 of FIG. 3; materials 1420, 1422, and 1424, respectively, of memory device 500 of FIG. 16 and memory device 1700 of FIG. 24; materials 2820, 2822, and 2824, respectively, of memory device 2500 of FIG. 29; materials 3220, 3722, and 3724, respectively, of memory device 3000 of FIG. 29; and materials 4021, 4722, and 4724, respectively, of memory device 4000 of FIG. 49. Thus, materials 6020, 6022, and 6024 of memory device 6000 of FIG. 60 can be formed with processes similar to processes that form the corresponding materials described above.

Electrode 6011 of memory device 6000 can be formed following the formation of materials 6020, 6022, 6024. As shown in FIG. 59, the structure of electrode 6011 is similar to, but having a different material from, the memory element described above, such as memory element 399 of memory device 300 of FIG. 3, memory element 1599 of memory device 500 of FIG. 16 and memory device 1700 of FIG. 24, memory element 2899 of memory device 2500 of FIG. 29, memory element 3899 of memory device 3000 of FIG. 39, or memory element 4899 of memory device 4000 of FIG. 49. Thus, in FIG. 60, forming electrode 6011 may include depositing a conductive material (instead of a chalcogenide material) over material 6024.

Some of the features of memory device 6000 shown in FIG. 60 can be substituted for a portion of memory devices 300, 500, 1700, 2500, 3000, and 4000, such that each memory cell in each of memory devices 300, 300, 500, 1700, 2500, 3000, 4000, and 5000 described above can have a structure of memory cell 6001 shown in FIG. 60. For example, the features between material 6024 and contact 6080, such as electrodes 6011 and 6012 and memory element 6099 of memory device 6000, can be substituted for memory element 399 of memory device 300 of FIG. 3; memory element 1599 of memory device 500 of FIG. 16 and memory device 1700 of FIG. 24; memory element 2899 of memory device 2500 of FIG. 29; memory element 3899 of memory device 3000 of FIG. 39; or memory element 4899 of memory device 4000 of FIG. 49. In another example, electrodes 6011 and 6012 and memory element 6099 of memory device 6000 can also be substituted for electrodes 5811 and 5812 and memory element 5899 of memory device 5000 of FIG. 58.

One or more embodiments described herein include apparatus and methods having a memory device with diodes coupled to memory elements. Each diode may be formed in a recess of the memory device. The recess may have a polygonal sidewall. The diode may include a first material of a first conductivity type (e.g., n-type) and a second material of a second conductive type (e.g., p-type) formed within the recess. Other embodiments including additional apparatus methods are described above with reference to FIG. 1 through FIG. 16.

The illustrations of apparatus such as memory devices 100, 200, 300, 500, 1700, 2500, 3000, 4000, 5000, 5900, and 6000, and memory cells 101, 201, 1501, 2801, 3801, 4801, 5801, 5901, and 6001 are intended to provide a general understanding of the structure of various embodiments and not a complete description of all the elements and features of the apparatus that might make use of the structures described herein.

The apparatus of various embodiments may include or be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer, multichip modules. Such apparatus may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Portions and features of some embodiments may be included in, or substituted for, those of others. Many other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A memory device comprising:
    trenches extending in a first direction and including a first trench and a second trench;
    trenches extending in a second direction and including a third trench and a fourth trench, the first direction being perpendicular to the first direction;
    a first insulation material in the first trenches;
    a second insulation material in the second trenches;
    recesses formed between the first material and the second material, the recesses including a recess having a first sidewall portion formed by a portion of the first insulation material in the first trench, a second sidewall portion formed by a portion of the second insulation material in the third trench, a third sidewall portion formed by a portion of the first insulation material in the second trench, and a fourth sidewall portion formed by a portion of the second insulation material in the fourth trench;
    a diode including a first material of a first conductivity type formed within the recess and a second material of a second conductive type formed within the recess, wherein at least one of the first and second materials is completely formed in the recess, the second material overlying the first material; and
    a memory element coupled to the diode, the memory element including a material overlying the second material.

2. The memory device of claim 1, wherein one of first and second materials includes a single crystalline silicon.

3. The memory device of claim 1, wherein the material of the memory element is located in the recess.

4. The memory device of claim 1, wherein the memory element includes a chalcogenide material.

5. The memory device of claim 1, wherein the diode and the memory element are coupled in series between a first conductive line and a second conductive line, and wherein the first and second conductive lines are perpendicular to each other.

6. The memory device of claim 1, wherein:
    the second sidewall portion is perpendicular to the first sidewall portion;
    the third sidewall portion is perpendicular to the second sidewall portion; and
    the fourth sidewall portion is perpendicular to the third sidewall portion.

7. The memory device of claim 6, wherein the first, second, third, and fourth sidewall portions include the same material.

8. A memory device comprising:
    trenches extending in a first direction and including a first trench and a second trench;

trenches extending in a second direction and including a third trench and a fourth trench, the first direction being perpendicular to the first direction;

a first insulation material in the first trenches;

a second insulation material in the second trenches;

recesses formed between the first material and the second material, the recesses including a recess having a first sidewall portion formed by a portion of the first insulation material in the first trench, a second sidewall portion formed by a portion of the second insulation material in the third trench, a third sidewall portion formed by a portion of the first insulation material in the second trench, and a fourth sidewall portion formed by a portion of the second insulation material in the fourth trench, wherein the first insulation material is different from the second insulation material;

a diode including a first material of a first conductivity type formed within the recess and a second material of a second conductivity type formed within the recess; and a memory element coupled to the diode.

9. The memory device of claim 8, wherein the first material includes silicon oxide, and the second material includes silicon nitride.

10. A memory device comprising:

trenches extending in a first direction and including a first trench and a second trench;

trenches extending in a second direction and including a third trench and a fourth trench, the first direction being perpendicular to the first direction;

a first insulation material in the first trenches;

a second insulation material in the second trenches;

recesses formed between the first material and the second material, the recesses including a recess having a first sidewall portion formed by a portion of the first insulation material in the first trench, a second sidewall portion formed by a portion of the second insulation material in the third trench, a third sidewall portion formed by a portion of the first insulation material in the second trench, and a fourth sidewall portion formed by a portion of the second insulation material in the fourth trench;

a diode located in the recess, the diode including a first material and a second material overlying the first material; and a memory element coupled to the diode, the memory element including a chalcogenide material located in the recess, the chalcogenide material overlying the second material.

11. The memory device of claim 10, wherein the first material includes an n-type material and the second material includes a p-type material.

12. The memory device of claim 11, wherein at least one of the n-type and p-type materials is completely formed in the recess.

13. The memory device of claim 11, wherein the n-type and p-type materials are completely formed in the recess.

14. The memory device of claim 10, wherein the the first and second insulation material include different materials.

15. The memory device of claim 14, wherein different materials include silicon oxide and silicon nitride.

16. A method comprising:

applying a signal to a conductive line of a memory device to access a memory element of a memory cell of the memory device, the memory device including:

trenches extending in a first direction and including a first trench and a second trench;

trenches extending in a second direction and including a third trench and a fourth trench, the first direction being perpendicular to the first direction;

a first insulation material in the first trenches;

a second insulation material in the second trenches;

recesses formed between the first material and the second material, the recesses including a recess having a first sidewall portion formed by a portion of the first insulation material in the first trench, a second sidewall portion formed by a portion of the second insulation material in the third trench, a third sidewall portion formed by a portion of the first insulation material in the second trench, and a fourth sidewall portion formed by a portion of the second insulation material in the fourth trench; and a diode coupled between the conductive line and the memory element, the diode including a first material of a first conductivity type formed within the recess and a second material of a second conductivity type formed within the recess, wherein at least one of the first and second materials is completely formed in the recess, the second material overlying the first material, and the memory element including a material overlying the second material.

17. The method of claim 16, wherein the signal is applied during a read operation of the memory device.

18. The method of claim 16, wherein the signal is applied during a write operation of the memory device.

* * * * *